(12) United States Patent
Miyake

(10) Patent No.: US 9,104,395 B2
(45) Date of Patent: Aug. 11, 2015

(54) PROCESSOR AND DRIVING METHOD THEREOF

(71) Applicant: Semiconductor Energy Laboratory, Co., Ltd., Atsugi-shi, Kanagawa-ken (JP)

(72) Inventor: Hiroyuki Miyake, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 276 days.

(21) Appl. No.: 13/874,516

(22) Filed: May 1, 2013

(65) Prior Publication Data
US 2013/0297952 A1 Nov. 7, 2013

(30) Foreign Application Priority Data

May 2, 2012 (JP) .................................. 2012-105140

(51) Int. Cl.
*G06F 1/26* (2006.01)
*G06F 1/32* (2006.01)
(Continued)

(52) U.S. Cl.
CPC ................ *G06F 1/26* (2013.01); *G06F 1/3287* (2013.01); *H01L 27/1156* (2013.01); *H01L 27/1225* (2013.01); *Y02B 60/1282* (2013.01); *Y02B 60/32* (2013.01)

(58) Field of Classification Search
CPC .... H01L 27/1225; H01L 29/24; H03K 17/16; H03K 10/00; G06F 1/3234; G06F 1/26
USPC ......................................................... 713/300
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1 737 044 A1 12/2006
EP 2 226 847 A2 9/2010
(Continued)

OTHER PUBLICATIONS

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
(Continued)

*Primary Examiner* — Vincent Tran
(74) *Attorney, Agent, or Firm* — Fish & Richardson P.C.

(57) ABSTRACT

To provide a processor with low power consumption, particularly a processor in which low power consumption is achieved by reducing leakage current from a high potential power supply line. A circuit of the processor used for a power gating driving method is divided into a first circuit block including a logic circuit and the like and used only in an arithmetic processing period, a second circuit block including a volatile memory element and the like and used in the arithmetic processing period, a data storage period, and a data restorage period, and a third circuit block including a nonvolatile memory element and the like and used in the data storage period and the data restorage period. The first to third circuit blocks are connected to first to third high potential power supply lines, respectively, and these lines are electrically connected to a fourth high potential power supply line which supplies power to the processor, through switches.

23 Claims, 11 Drawing Sheets

(51) Int. Cl.
*H01L 27/115* (2006.01)
*H01L 27/12* (2006.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,657,911 B2 | 12/2003 | Yamaoka et al. |
| 6,727,522 B1 | 4/2004 | Kawasaki et al. |
| 6,914,803 B2 | 7/2005 | Yamaoka et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,099,183 B2 | 8/2006 | Yamaoka et al. |
| 7,105,868 B2 | 9/2006 | Nause et al. |
| 7,211,825 B2 | 5/2007 | Shih et al |
| 7,272,068 B2 | 9/2007 | Yamaoka et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,474,584 B2 | 1/2009 | Yamaoka et al. |
| 7,501,293 B2 | 3/2009 | Ito et al. |
| 7,623,364 B2 | 11/2009 | Sasaki et al. |
| 7,646,662 B2 | 1/2010 | Yamaoka et al. |
| 7,674,650 B2 | 3/2010 | Akimoto et al. |
| 7,732,819 B2 | 6/2010 | Akimoto et al. |
| 7,868,479 B2 | 1/2011 | Subramaniam |
| 7,872,891 B2 | 1/2011 | Sasaki et al. |
| 7,961,545 B2 | 6/2011 | Yamaoka et al. |
| 8,046,615 B2 | 10/2011 | Taguchi et al. |
| 8,681,533 B2 * | 3/2014 | Fujita ............... 365/149 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0160544 A1 * | 6/2009 | Otsuga et al. ............... 327/564 |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0085400 A1 * | 4/2011 | Sasaki et al. ............... 365/226 |
| 2011/0110145 A1 | 5/2011 | Yamazaki et al. |
| 2011/0140099 A1 | 6/2011 | Yamazaki |
| 2011/0176357 A1 | 7/2011 | Koyama et al. |
| 2011/0296211 A1 * | 12/2011 | Ramaraju et al. .......... 713/320 |
| 2012/0243340 A1 * | 9/2012 | Kobayashi et al. ........ 365/189.2 |
| 2012/0274356 A1 | 11/2012 | Takahashi |
| 2012/0274379 A1 * | 11/2012 | Yoneda et al. ............... 327/208 |
| 2012/0294069 A1 * | 11/2012 | Ohmaru et al. ............. 365/149 |
| 2013/0134416 A1 | 5/2013 | Nishijima et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-298410 A | 10/2003 |
| JP | 2004-103957 A | 4/2004 |
| JP | 2004-273614 A | 9/2004 |
| JP | 2004-273732 A | 9/2004 |
| JP | 2009-116851 A | 5/2009 |
| WO | 2004/114391 A1 | 12/2004 |

OTHER PUBLICATIONS

Orita, M et al., "Amorphous transparent conductive oxide InGaO3(ZnO)m (m<4):a Zn4s conductor," Philosophical Magazine, 2001, vol. 81, No. 5, pp. 501-515.

(56) References Cited

OTHER PUBLICATIONS

Orita, M et al., "Mechanism of Electrical Conductivity of Transparent InGaZnO4," Phys. Rev. B (Physical Review. B), Jan. 15, 2000, Vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size Amoled," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. Amoled Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA Amoled Driven by the Threshold Voltage Controlled Amorphous GIZO (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Asakuma, N et al., "Crystallization and Reduction of SOL-GEL-Derived Zinc Oxide Films by Irradiation With Ultraviolet Lamp," Journal of SOL-GEL Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTs) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA Amoled Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission Amoled Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

(56) References Cited

OTHER PUBLICATIONS

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," JPN. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA Amoled Display Using In—Ga—Zn—Oxide TFTs With a Novel Passivation Layer," SID Digest '09 : SID International Symposium Digest of Technical Papers, May 31, 2009, pp. 284-287.

Masakazu Murakami et al.; "Theoretical Examination on a Significantly Low Off-State Current of a Transistor using Crystalline In—Ga—Zn—Oxide"; AM-FPD '12 Digest of Technical Papers; Jul. 4, 2012; pp. 171-174.

\* cited by examiner

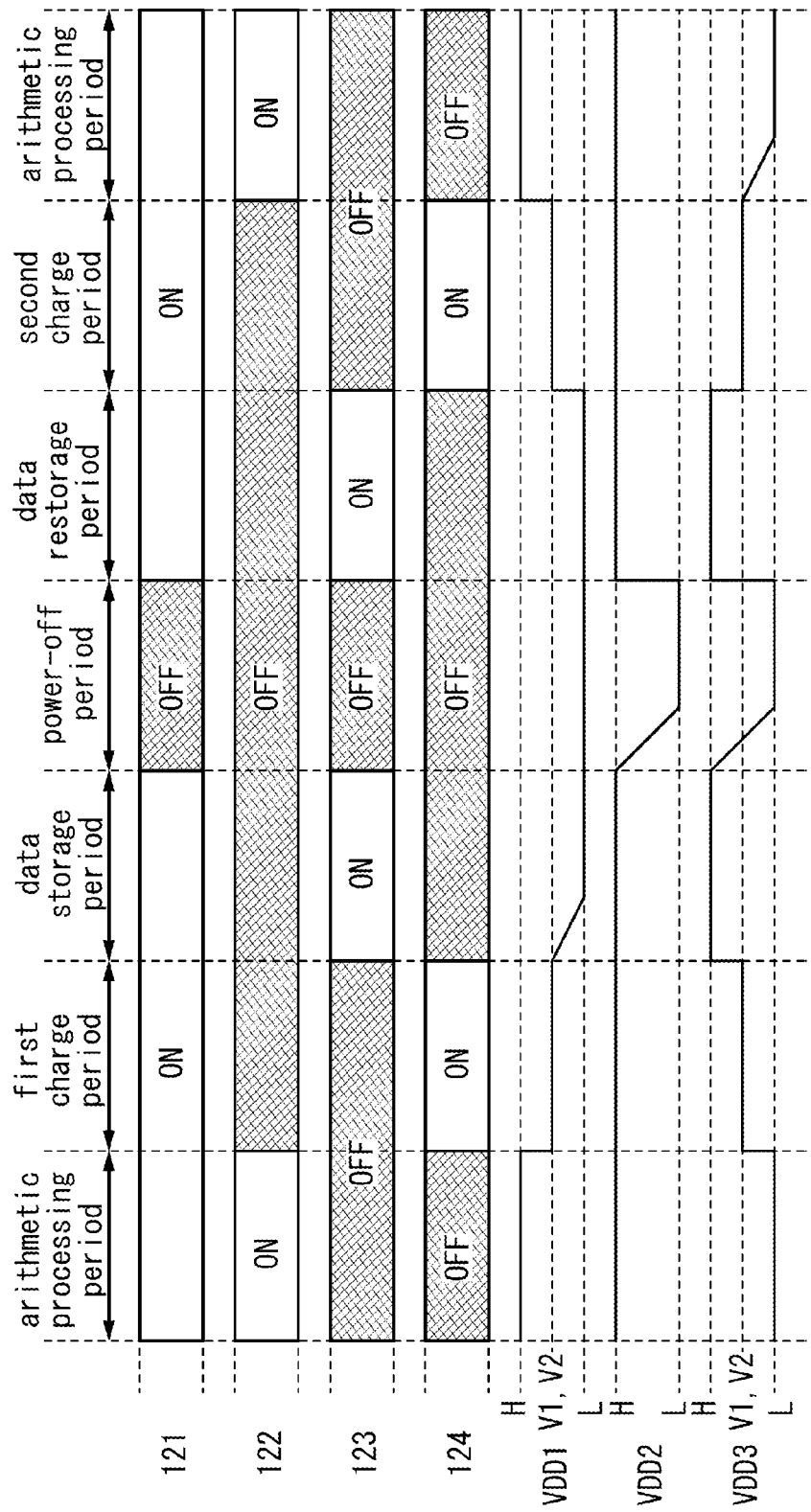

PROCESSOR AND DRIVING METHOD THEREOF

BACKGROUND OF THE INVENTION

1. Field of the Invention

The disclosed invention relates to a processor, particularly a processor that uses a power gating driving method.

Here, a processor means a processing unit having an arithmetic unit and a controller. For example, a microprocessor, a CPU, and an MPU are processors.

2. Description of the Related Art

These days, as a technology for downsizing a semiconductor element is improved, the integration degree of a processor such as a CPU or an MPU is markedly improved, and the processing speed of the processor is greatly increased. On the other hand, as the semiconductor element becomes small, the number of semiconductor elements provided in the processor greatly increases, and the power consumption of the semiconductor element due to leakage current markedly increases.

One of driving methods for reducing the power consumption of a processor is a method for driving a processor that is called power gating (hereinafter also referred to as a power gating driving method). A power gating driving method is a driving method in which in a period during which a processor does not need to perform arithmetic processing, supply of power to at least part of the processor is stopped to prevent consumption of wasted power.

A volatile memory element such as a register or an SRAM is usually used as a memory element in a processor. When supply of power to the processor is stopped by the power gating driving method, data in the volatile memory element provided in the processor is lost. In contrast, by providing a flash memory that is a nonvolatile memory element in a processor and writing data in a volatile memory element to the nonvolatile memory element when supply of power is stopped, the data can be retained (for example, see Patent Document 1).

REFERENCE

Patent Document

[Patent Document 1] Japanese Published Patent Application No. 2009-116851

SUMMARY OF THE INVENTION

In the power gating driving method with use of the nonvolatile memory element, a period during which data in a volatile memory element of the processor is written in a nonvolatile memory element (hereinafter the period is referred to as a data storage period) is provided between a period during which normal arithmetic processing is performed (hereinafter the period is referred to as an arithmetic processing period) and a period during which supply of power to the processor is stopped (hereinafter the period is referred to as a power-off period). On the other hand, a period during which the data in the nonvolatile memory element is written in the volatile memory element (hereinafter the period is referred to as a data restorage period) is provided between the power-off period and the arithmetic processing period.

In other words, in the above power gating driving method, the processor performs four processes of the arithmetic processing period, the data storage period, the power-off period, and the data restorage period in this order. When data restorage is completed, the processor repeats this cycle from the arithmetic processing period.

The processor operates in the arithmetic processing period, the data storage period, and the data restorage period; however, it is not necessary that all components provided in the processor operate in these periods. A logic circuit which performs arithmetic processing and the like or a circuit relating to control thereof and the like need to operate in the arithmetic processing period but do not necessarily operate in the data storage period and the data restorage period. In contrast, a nonvolatile memory element which retains data in a volatile memory element or a circuit relating to control thereof and the like necessarily operates in the data storage period and the data restorage period but do not necessarily operate in the arithmetic processing period.

However, high voltage power is supplied to a circuit which is used only in the arithmetic period, such as a logic circuit, through a high potential power supply line even in the data storage period and the data restorage period. Even in the arithmetic period, high voltage power is supplied to a circuit such as a nonvolatile memory element. Further, also in these circuits which do not operate, leakage current from a high potential power supply line is generated, which leads to an increase in power consumption due to the leakage current.

In view of the above problems, it is an object of one embodiment of the disclosed invention to provide a processor in which low power consumption is achieved. In particular, it is an object of one embodiment of the disclosed invention to provide a processor in which low power consumption is achieved by reducing leakage current from a high potential power supply line.

In the disclosed invention, a circuit of the processor used for a power gating driving method is divided into a first circuit block including a logic circuit and the like, a second circuit block including a volatile memory element and the like, and a third circuit block including a nonvolatile memory element and the like. The first circuit block is used only in the arithmetic processing period, the second circuit block is used in the arithmetic processing period, the data storage period, and the data restorage period, and the third circuit block is used in the data storage period and the data restorage period. The first to third circuit blocks are connected to first to third high potential power supply lines, respectively, and these lines are electrically connected to a fourth high potential power supply line which supplies power to the processor, through switches. With such a structure, unnecessary supply of power to the first circuit block and the third circuit block can be stopped in a period other than the power-off period; thus, low power consumption can be achieved by reducing leakage current from the high potential power supply line of the circuit block.

Further, in the disclosed invention, the first high potential power supply line and the third high potential power supply line are electrically connected to each other through a switch. With such a structure, a period during which electric charge from the first high potential power supply line is accumulated in the third high potential power supply line (hereinafter the period is referred to as a first charge period) is provided between the arithmetic processing period and the data storage period, whereby reduction in power consumption can be achieved. In addition, a period during which electric charge from the third high potential power supply line is accumulated in the first high potential power supply line (hereinafter the period is referred to as a second charge period) is provided between the data restorage period and the arithmetic processing period, whereby reduction in power consumption can be achieved. Specifically, structures described below can be employed, for example.

One embodiment of the disclosed invention is a processor which includes a first circuit block connected to a first high potential power supply line, a second circuit block at least including a first memory element and connected to a second high potential power supply line, and a third circuit block at least including a second memory element and connected to a third high potential power supply line. The first high potential power supply line is electrically connected to a fourth high potential power supply line through a first switch and a second switch. The second high potential power supply line is electrically connected to the fourth high potential power supply line through the first switch. The third high potential power supply line is electrically connected to the fourth high potential power supply line through the first switch and a third switch and to the first high potential power supply line through a fourth switch. The first to third circuit blocks are electrically connected to a low potential power supply line.

In the above, operation of the processor can be divided into the following periods: an arithmetic processing period during which normal arithmetic processing is performed; a data storage period during which data is stored from the first memory element to the second memory element; a power-off period during which the first to third circuit blocks and the fourth high potential power supply line are set in a non-conduction state; a data restorage period during which data is restored from the second memory element to the first memory element; and a first charge period during which electric charge from the first circuit block is accumulated in the third circuit block and which is provided between the arithmetic processing period and the data storage period. In the arithmetic processing period, at least the first switch and the second switch are in a conduction state. In the data storage period, at least the first switch and the third switch are in a conduction state. In the power-off period, at least the first switch is in a non-conduction state. In the data restorage period, at least the first switch and the third switch are in a conduction state. In the first charge period, at least the first switch and the fourth switch are in a conduction state and the second switch and the third switch are in a non-conduction state.

In the above, the processor further includes a second charge period during which electric charge from the third circuit block is accumulated in the first circuit block and which is provided between the data restorage period and the arithmetic processing period next to the data restorage period. In the second charge period, at least the first switch and the fourth switch are in a conduction state and the second switch and the third switch are in a non-conduction state.

In the above, the first memory element can be a register. The second memory element preferably includes a transistor including an oxide semiconductor. The first switch preferably includes a transistor including an oxide semiconductor. One or more of the second switch to the fourth switch preferably include a transistor including an oxide semiconductor.

Note that in this specification and the like, the term "high potential H" means a potential high enough to turn on an n-channel transistor and turn off a p-channel transistor provided in a processor when the potential is supplied to gate electrodes. Further, in this specification and the like, the term "low potential L" means a potential low enough to turn off an n-channel transistor and turn on a p-channel transistor provided in a processor when the potential is supplied to gate electrodes.

Note that in this specification and the like, the term "over" or "below" does not necessarily mean that a component is placed directly on or directly under another component. For example, the expression "a gate electrode over a gate insulating layer" does not exclude the case where another component is placed between the gate insulating layer and the gate electrode.

In this specification and the like, the term "electrode" or "wiring" does not limit the function of a component. For example, an electrode can be used as part of a wiring, and the wiring can be used as part of the electrode. The term "electrode" or "wiring" can also mean a combination of a plurality of electrodes or wirings, for example.

Functions of a "source" and a "drain" are sometimes replaced with each other when a transistor of opposite polarity is used or when the direction of current flowing is changed in circuit operation, for example. Thus, in this specification and the like, the terms "source" and "drain" can be replaced with each other.

Note that in this specification and the like, the expression "electrically connected" includes the case where components are connected to each other through an "object having any electric function". Here, there is no particular limitation on an "object having any electric function" as long as electric signals can be transmitted and received between components that are connected to each other.

Examples of an "object having any electric function" include an electrode, a wiring, a switching element such as a transistor, a resistor, an inductor, a capacitor, and an element with a variety of functions.

According to one embodiment of the disclosed invention, a processor in which low power consumption is achieved can be provided. In particular, a processor in which low power consumption is achieved by reducing leakage current from a high potential power supply line can be provided.

BRIEF DESCRIPTION OF THE DRAWINGS

In the accompanying drawings:
FIG. 3 is a timing chart showing operation of the processor according to one embodiment of the disclosed invention.

DETAILED DESCRIPTION OF THE INVENTION

Figure 1:
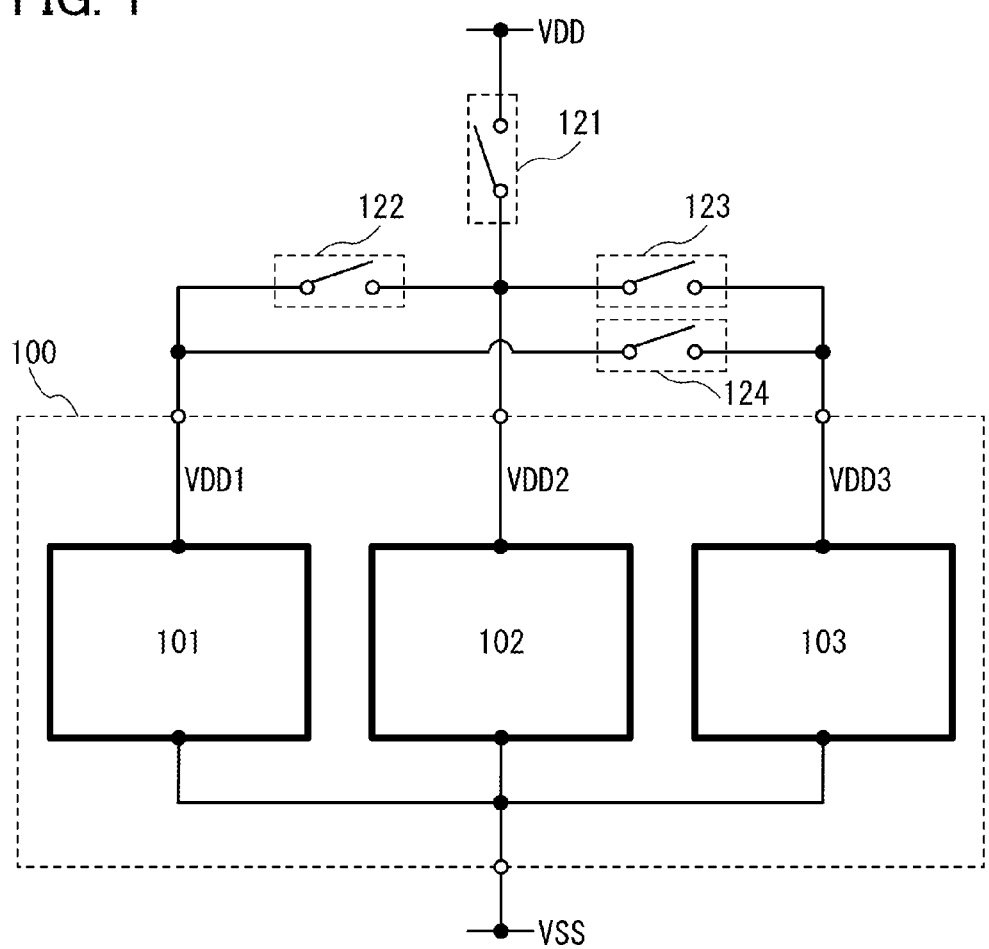
FIG. 1 is a block diagram of a processor according to one embodiment of the disclosed invention.

Examples of embodiments of the present invention will be described below with reference to the drawings. Note that the present invention is not limited to the following description. It will be readily appreciated by those skilled in the art that modes and details of the present invention can be changed in various ways without departing from the spirit and scope of the present invention. The present invention therefore should not be construed as being limited to the following description of the embodiments.

Note that the position, size, range, or the like of each component illustrated in drawings and the like is not accurately represented in some cases for easy understanding. The disclosed invention is therefore not necessarily limited to the position, size, range, or the like disclosed in the drawings and the like.

Note that in this specification and the like, ordinal numbers such as "first", "second", and "third" are used in order to avoid confusion among components and do not limit the number.

Embodiment 1

In this embodiment, structures and operations of a processor according to one embodiment of the disclosed invention are described with reference to FIG. 1, FIGS. 2A to 2C, FIG. 3, and FIGS. 4A and 4B.

For the processor in this embodiment, a power gating driving method including an arithmetic processing period, a data storage period, a power-off period, and a data restorage period is employed. In addition, in the power gating driving method, one or both of a first charge period between the arithmetic processing period and the data storage period and a second charge period between the data restorage period and the arithmetic processing period can be provided.

The structure of a processor that can use such a power gating driving method is described below.

The structure of the processor according to one embodiment of the disclosed invention is illustrated in a block diagram of FIG. 1. A processor 100 in FIG. 1 includes a first circuit block 101 at least including a logic circuit and connected to a first high potential power supply line VDD1, a second circuit block 102 at least including a volatile memory element and connected to a second high potential power supply line VDD2, and a third circuit block 103 at least including a nonvolatile memory element and connected to a third high potential power supply line VDD3. Here, the first high potential power supply line VDD1 is electrically connected to a fourth high potential power supply line VDD through a first switch 121 and a second switch 122. The second high potential power supply line VDD2 is electrically connected to the fourth high potential power supply line VDD through the first switch 121. The third high potential power supply line VDD3 is electrically connected to the fourth high potential power supply line VDD through the first switch 121 and a third switch 123 and to the first high potential power supply line VDD1 through a fourth switch 124. The first to third circuit blocks are electrically connected to a low potential power supply line VSS.

The fourth high potential power supply line VDD is electrically connected to a power supply which is not illustrated and supplied with a high potential H. The low potential power supply line VSS is supplied with a low potential L, e.g., a ground potential (GND).

The first circuit block 101 includes a plurality of logic circuits and also includes a circuit relating to control thereof and the like. The plurality of logic circuits and the circuit relating to control thereof and the like are circuits for performing normal arithmetic processing of the processor 100 in the arithmetic processing period. In other words, the first circuit block 101 can be referred to as a circuit which operates in the arithmetic processing period. The plurality of logic circuits and the circuit relating to control thereof and the like which are included in the first circuit block 101 can be used in, for example, an arithmetic logic circuit (ALU).

The second circuit block 102 includes a plurality of volatile memory elements and also includes a circuit relating to control thereof and the like. The plurality of volatile memory elements and the circuit relating to control thereof and the like perform data writing and data reading in the arithmetic processing period. In the data storage period, data which has been written in the arithmetic processing period is written in a nonvolatile memory element to be described later. In the data restorage period, the data written in the nonvolatile memory element in the data storage period is written again. In other words, the second circuit block 102 can be referred to as a circuit which operates in the arithmetic processing period, the data storage period, and the data restorage period.

Since the volatile memory element included in the second circuit block 102 performs data writing and data reading in the arithmetic processing period as described above, access speed of the volatile memory element is higher than at least that of the nonvolatile memory element to be described later.

A semiconductor material used for a transistor included in the above logic circuit or the volatile memory element is not particularly limited. However, the semiconductor material preferably has a band gap width different from that of a semiconductor material used for a transistor with low off-state current in the nonvolatile memory element to be described later. Such a semiconductor material can be, for example, silicon, germanium, silicon germanium, or gallium arsenide and is preferably single crystal. In order to increase the speed of processing data, it is preferable to use, for example, a transistor with high switching speed, such as a transistor formed using single crystal silicon.

The third circuit block 103 includes a plurality of nonvolatile memory elements and also includes a circuit relating to control thereof and the like. The plurality of nonvolatile memory elements and the circuit relating to control thereof and the like store data in the volatile memory elements in the data storage period and restore the data stored in the data storage period to the volatile memory elements in the data restorage period. In other words, the third circuit block 103 can be referred to as a circuit which operates in the data storage period and the data restorage period.

The nonvolatile memory element included in the third circuit block 103 has a longer data retention time than at least the volatile memory element to which power is not supplied. The nonvolatile memory element is electrically connected to a node holding electric charge corresponding to data in the volatile memory element and is used for storing data from the volatile memory element in the power-off period. Thus, the nonvolatile memory element has a longer data retention time than at least the volatile memory element.

Figure 2A:
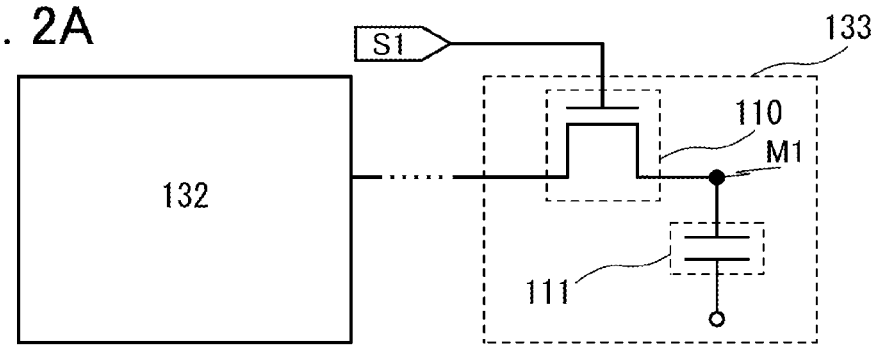
FIGS. 2A to 2C are circuit diagrams of processors according to one embodiment of the disclosed invention.
Figure 2B:
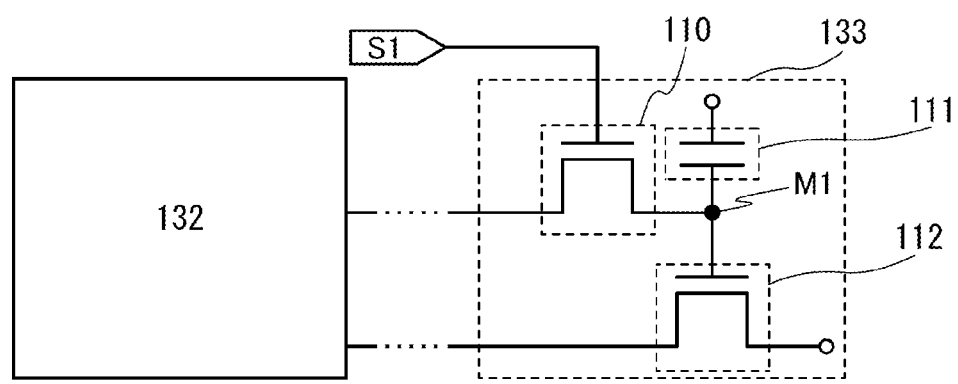
Figure 2C:
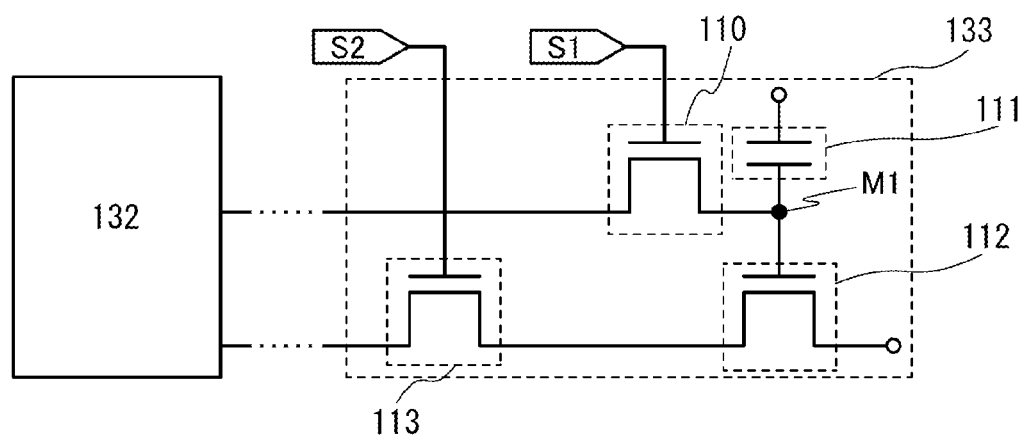

Here, examples of a structure of the nonvolatile memory element in the third circuit block 103 are described using circuit diagrams in FIGS. 2A to 2C. A volatile memory element 132 in each of FIGS. 2A to 2C is one of the volatile memory elements in the second circuit block 102. A nonvolatile memory element 133 is one of the nonvolatile memory elements in the third circuit block 103.

The nonvolatile memory element 133 in FIG. 2A includes a transistor 110 and a capacitor 111 and is electrically connected to the volatile memory element 132 through the transistor 110. Note that in this embodiment, the transistor 110 is an n-channel transistor; however, a p-channel transistor may be used as appropriate. In such a case, a potential supplied to a gate electrode is inverted as appropriate.

Specifically, a source electrode (or a drain electrode) of the transistor 110 is electrically connected to a node holding electric charge corresponding to data in the volatile memory element 132. The drain electrode (or the source electrode) of the transistor 110 is electrically connected to one electrode of the capacitor 111 (hereinafter the node is referred to as a node M1 in some cases). A control signal S1 is supplied to the gate electrode of the transistor 110, and the transistor 110 is turned on or off in accordance with the potential of the control signal S1. A predetermined potential is supplied to the other electrode of the capacitor 111. Here, the predetermined potential is, for example, a ground potential (GND). By providing the capacitor 111 in this manner, much electric charge can be held of the node M1, so that data retention characteristics can be improved.

The transistor 110 is preferably a transistor with extremely low off-state current. The transistor with extremely low off-state current preferably includes, in a channel formation region, a wide band gap semiconductor having a wider band gap and lower intrinsic carrier density than single crystal silicon. For example, the band gap of the wide band gap semiconductor is more than 1.1 eV, preferably 2.5 eV or more and 4 eV or less, more preferably 3 eV or more and 3.8 eV or less. For example, as the wide band gap semiconductor, a compound semiconductor such as silicon carbide (SiC) or gallium nitride (GaN), an oxide semiconductor formed using metal oxide such as an In—Ga—Zn-based oxide semiconductor, or the like can be used. Alternatively, since a transistor including amorphous silicon, microcrystalline silicon, or the like can have lower off-state current than a transistor including single crystal silicon, the transistor 110 may employ amorphous silicon, microcrystalline silicon, or the like.

Here, the band gap of single crystal silicon is approximately 1.1 eV, and even in a state where there is no carrier caused by a donor or an acceptor (i.e., even in the case of an intrinsic semiconductor), the concentration of thermally excited carriers is approximately $1 \times 10^{11}$ cm$^{-3}$. The band gap of the In—Ga—Zn-based oxide semiconductor which is the wide band gap semiconductor is approximately 3.2 eV and the concentration of thermally excited carriers is approximately $1 \times 10^{-7}$ cm$^{-3}$. The off-state resistance (resistance between a source and a drain of a transistor in an off state) of a transistor is inversely proportional to the concentration of thermally excited carriers in the channel formation region. Accordingly, the resistivity of the In—Ga—Zn-based oxide semiconductor at the time when the transistor is off is 18 orders of magnitude higher than that of silicon.

By using such a wide band gap semiconductor for the transistor 110, for example, off-state current (per unit channel width (1 μm), here) at room temperature (25° C.) is 100 zA (1 zA (zeptoampere) is $1 \times 10^{-21}$ A) or lower, preferably 10 zA or lower.

For example, when the off-state current of the transistor 110 at room temperature (25° C.) (per unit channel width (1 μm), here) is 10 zA or lower, data can be retained for $10^4$ seconds or longer. Needless to say, the retention time depends on the characteristics of the transistor, a capacitance value of a capacitor in the electrode of the transistor and the like.

In this embodiment, a transistor with extremely low off-state current that is used as the transistor 110 is a transistor including an oxide semiconductor.

When data is stored from the volatile memory element 132, by turning on the transistor 110 by supply of a high potential as the control signal S1, the potential of the node holding electric charge corresponding to data in the volatile memory element 132 is supplied to the node M1. After that, by turning off the transistor 110 by supply of a low potential as the control signal S1, electric charge supplied to the node M1 is held. Here, since the off-state current of the transistor 110 is extremely low, electric charge of the node M1 is held for a long time.

When data is restored to the volatile memory element 132, by turning on the transistor 110 by supply of a high potential as the control signal S1, the potential of the node M1 is supplied to the node holding electric charge corresponding to data in the volatile memory element 132.

By using a wide band gap semiconductor or the like for the transistor 110, the off-state current of the transistor 110 can be extremely low. Thus, by turning off the transistor 110, the potential of the node M1 can be held for an extremely long time. With such a structure, the nonvolatile memory element 133 can be used as a nonvolatile memory element capable of retaining data without supply of power.

As illustrated in FIG. 2B, the nonvolatile memory element 133 may include a transistor 112 in addition to the components in FIG. 2A. A gate electrode of the transistor 112 is electrically connected to the node M1. A drain electrode (or a source electrode) of the transistor 112 is electrically connected to the node holding electric charge corresponding to data in the volatile memory element 132. A predetermined potential is supplied to the source electrode (or the drain electrode) of the transistor 112.

In the nonvolatile memory element 133 in FIG. 2B, the state of the transistor 112 depends on a potential held in the node M1 in the data storage. In other words, the transistor 112 is turned on when a high potential is supplied in the data storage, and the transistor 112 is turned off when a low potential is supplied in the data storage.

In data restorage, the potential of the drain electrode of the transistor 112 is supplied to the node holding electric charge corresponding to data in the volatile memory element 132. In other words, when a high potential is supplied to the node M1 in the data storage, the transistor 112 is on, and the potential of the source electrode of the transistor 112 is supplied to the volatile memory element 132. Further, when a low potential is supplied to the node M1 in the data storage, the transistor 112 is off, and the potential of the source electrode of the transistor 112 is not supplied to the volatile memory element 132.

In order to increase the speed of reading data, it is preferable to use a transistor that is similar to the transistor used for the volatile memory element as the transistor 112.

Note that the source electrode of the transistor 112 and the other electrode of the capacitor 111 may have the same potential or different potentials. The source electrode of the transistor 112 and the other electrode of the capacitor 111 may be electrically connected to each other. Further, the capacitor 111 is not necessarily provided. For example, in the case where the parasitic capacitance of the transistor 112 is high, the parasitic capacitance can be used instead of the capacitor 111.

Here, the drain electrode of the transistor 110 and the gate electrode of the transistor 112 (i.e., the node M1) have the same effect as a floating gate of a floating-gate transistor used as a nonvolatile memory element. However, since data can be directly rewritten by turning on or off the transistor 110, injection of electric charge into a floating gate and extraction of electric charge from the floating gate with the use of high voltage are not necessary. In other words, in the nonvolatile memory element 133, high voltage needed for writing or erasing data in a conventional floating gate transistor is not necessary. Thus, by using the nonvolatile memory element 133 in this embodiment, power consumption needed for data storage can be reduced.

For similar reasons, a decrease in operation speed due to data writing or data erasing can be reduced; thus, the nonvolatile memory element 133 can operate at high speed. Further, for similar reasons, the problem of deterioration of a gate insulating film (a tunnel insulating film) that is pointed out in a conventional floating gate transistor does not exist. In other words, unlike in a conventional floating gate transistor, the nonvolatile memory element 133 in this embodiment has no limitation on the number of writings in principle. From the above, the nonvolatile memory element 133 can be adequately used as a storage device that needs many rewritings and high-speed operation, such as a register.

As illustrated in FIG. 2C, the nonvolatile memory element 133 may include a transistor 113 in addition to the components in FIG. 2B. A control signal S2 is supplied to a gate electrode of the transistor 113. A drain electrode (or a source electrode) of the transistor 113 is electrically connected to the node holding electric charge corresponding to data in the volatile memory element 132. The source electrode (or the drain electrode) of the transistor 113 is electrically connected to the drain electrode of the transistor 112.

Here, the control signal S2 is a signal for supplying a high potential to the gate electrode of the transistor 113 at the time of the data restorage. In this case, the transistor 113 can be turned on. Accordingly, at the time of the data restorage, a potential based on the on state or off state of the transistor 112 can be supplied to the node holding electric charge corresponding to data in the volatile memory element 132.

Note that in order to increase the speed of reading data, it is preferable to use a transistor that is similar to the transistor used for the volatile memory element as the transistor 113.

Note that the structure of the nonvolatile memory element 133 is not limited to the structures in FIGS. 2A to 2C. For example, a phase change memory (PCM), a resistance random access memory (ReRAM), a magnetoresistive random access memory (MRAM), a ferroelectric random access memory (FeRAM), or a flash memory can be used.

Note that the plurality of volatile memory elements in the second circuit block 102, the plurality of nonvolatile memory elements in the third circuit block 103, and the circuits relating to control of the volatile/nonvolatile memory elements and the like can form, for example, a buffer register temporarily storing input data or the result of arithmetic processing of the ALU, or a general-purpose register. Further, in the case where a cache memory including a static random access memory (SRAM) and the like is provided in the processor 100, the plurality of volatile memory elements in the second circuit block 102, the plurality of nonvolatile memory elements in the third circuit block 103, and the circuits relating to control of the volatile/nonvolatile memory elements and the like can form the cache memory.

The first circuit block 101 to the third circuit block 103 which are described above are connected to the first high potential power supply line VDD1 to the third high potential power supply line VDD3, respectively, and are supplied with the high potential H from the fourth high potential power supply line VDD through the lines.

In this case, the first high potential power supply line VDD1 is electrically connected to the fourth high potential power supply line VDD through the first switch 121 and the second switch 122; the second high potential power supply line VDD2 is electrically connected to the fourth high potential power supply line VDD through the first switch 121; and the third high potential power supply line VDD3 is electrically connected to the fourth high potential power supply line VDD through the first switch 121 and the third switch 123. Further, the third high potential power supply line VDD3 is electrically connected to the first high potential power supply line VDD1 through the fourth switch 124. Note that in the case where the first switch 121 to the fourth switch 124 are formed using transistors, the switches are in a conduction state when the transistors are in an on state and the switches are in a non-conduction state when the transistors are in an off state.

In other words, the first switch 121 to the third switch 123 control supply of the high potential H from the fourth high potential power supply line VDD connected to the power supply which is not illustrated to the first circuit block 101 to the third circuit block 103 of the processor 100.

Here, the following structure is assumed: only the first switch 121 is provided between the fourth high potential power supply line VDD and the processor 100; and the first high potential power supply line VDD1 to the third high potential power supply line VDD3 are always in a conduction state. In such a processor, the high potential H is supplied to the whole circuit in the arithmetic processing period, the data storage period, and the data restorage period.

Thus, the high potential H is supplied to the first circuit block 101 even in the data storage period and the data restorage period during which the logic circuit and the circuit relating to control thereof and the like do not need to operate. Further, the high potential H is supplied to the third circuit block 103 even in the arithmetic processing period during which the nonvolatile memory element and the circuit relating to control thereof and the like do not need to operate. Thus, leakage current flows from the high potential power supply line of the circuit block which does not need to operate to the low potential power supply line through the transistor or the like, so that power consumption due to the leakage current is increased.

In contrast, as described in this embodiment, with the use of the second switch 122, supply of power to the first circuit block 101 is stopped in a period during which only the first circuit block 101 is not used, such as the data storage period and the data restorage period, so that reduction in leakage current by the second switch 122 at this time can be achieved. With such reduction in the leakage current, power consumption due to the leakage current can be reduced.

Also as described in this embodiment, with the third switch 123, in the arithmetic processing period during which only the third circuit block 103 is not used, supply of power to the third circuit block 103 is stopped, so that reduction in leakage current by the third switch 123 at this time can be achieved. With such reduction in the leakage current, power consumption due to the leakage current can be reduced.

By setting the second switch 122 and the third switch 123 in a non-conduction state and the fourth switch 124 in a conduction state, electric charge is transferred from the first high potential power supply line VDD1 to the third high potential power supply line VDD3 or from the third high potential power supply line VDD3 to the first high potential power supply line VDD1, the third circuit block 103 or the first circuit block 101 is charged, and power consumption can be reduced.

The first switch 121 to the fourth switch 124 are preferably transistors with off-state current lower than that of the transistor used in the volatile memory element, more preferably, transistors with extremely low off-state current which are similar to the transistor 110 in FIGS. 2A to 2C.

When the first switch 121 to the fourth switch 124 formed using transistors with extremely low off-state current are used as described above, leakage current can be further reduced in the first switch 121 to the fourth switch 124 which are connected to the fourth high potential power supply line VDD. In particular, when a transistor with extremely low off-state current is used as the first switch 121, at least in the power-off period during which supply of power to the first circuit block 101 to the third circuit block 103 is stopped, leakage current from the fourth high potential power supply line VDD is further reduced, so that power consumption of the processor can be further reduced.

Here, a power gating driving method of the processor 100 according to this embodiment is described with reference to FIG. 3 and FIGS. 4A and 4B. FIG. 3 is a timing chart showing on/off states of the first switch 121 to the fourth switch 124 and potentials of the first high potential power supply line VDD1 to the third high potential power supply line VDD3, in the arithmetic processing period, the first charge period, the data storage period, the power-off period, the data restorage period, and the second charge period in the processor 100. Respective reference numerals shown beside the timing chart correspond to the first switch 121 to the fourth switch 124 and the first high potential power supply line VDD1 to the third high potential power supply line VDD3.

The processor 100 operates in the following divided periods: the arithmetic processing period during which normal arithmetic processing is performed using the first circuit block 101 and the second circuit block 102; the first charge period during which electric charge from the first high potential power supply line VDD1 is accumulated in the third high potential power supply line VDD3; the data storage period during which data is stored from a volatile memory element of the second circuit block 102 to a nonvolatile memory element of the third circuit block 103; the power-off period during which the first high potential power supply line VDD1 to the third high potential power supply line VDD3 and the fourth high potential power supply line VDD are set in a non-conduction state; the data restorage period during which data is restored from the nonvolatile memory element of the third circuit block 103 to the volatile memory element of the second circuit block 102; and the second charge period during which electric charge from the third high potential power supply line VDD3 is accumulated in the first high potential power supply line VDD1.

In the arithmetic processing period, the first switch 121 and the second switch 122 are set in a conduction state and the third switch 123 and the fourth switch 124 are set in a non-conduction state. Thus, the high potential H of the fourth high potential power supply line VDD is supplied to the first high potential power supply line VDD1 and the second high potential power supply line VDD2. Consequently, the first high potential power supply line VDD1 is set to the high potential H, the second high potential power supply line VDD2 is set to the high potential H, and the third high potential power supply line VDD3 is set to the low potential L.

Since the high potential H is supplied to the first high potential power supply line VDD1 and the second high potential power supply line VDD2, the processor 100 can perform normal arithmetic processing using the first circuit block 101 and writing and reading data caused by the arithmetic processing using the second circuit block 102. Further, since the third high potential power supply line VDD3 is set to the low potential L and leakage current from the third high potential power supply line VDD3 is reduced, power consumption can be reduced in the third circuit block 103 which does not need to be used in the arithmetic processing period.

In the first charge period, the first switch 121 and the fourth switch 124 are set in a conduction state and the second switch 122 and the third switch 123 are set in a non-conduction state. At this time, it is preferable that the second switch 122 change from a conduction state to a non-conduction state before the fourth switch 124 changes from a non-conduction state to a conduction state. Thus, the high potential H of the fourth high potential power supply line VDD is supplied to the second high potential power supply line VDD2. The first high potential power supply line VDD1 and the third high potential power supply line VDD3 become a conduction state and the fourth high potential power supply line VDD and each of the first high potential power supply line VDD1 and the third high potential power supply line VDD 3 become a non-conduction state. Consequently, the first high potential power supply line VDD1 is set to a potential V1, the second high potential power supply line VDD2 is set to the high potential H, and the third high potential power supply line VDD3 is set to the potential V1.

Since the high potential H is supplied to the second high potential power supply line VDD2, the processor 100 can retain data written in a volatile memory element of the second circuit block 102 in the first charge period.

Further, electric charge from the first high potential power supply line VDD1 can be accumulated in the third high potential power supply line VDD3. Here, in the case where the fourth switch 124 is not provided, the electric charge is discharged from the first high potential power supply line VDD1 which is set in a non-conduction state; in contrast, in the case where the fourth switch 124 is provided as described in this embodiment, the third high potential power supply line VDD3 which is set to the low potential L can be charged.

Figure 4A:
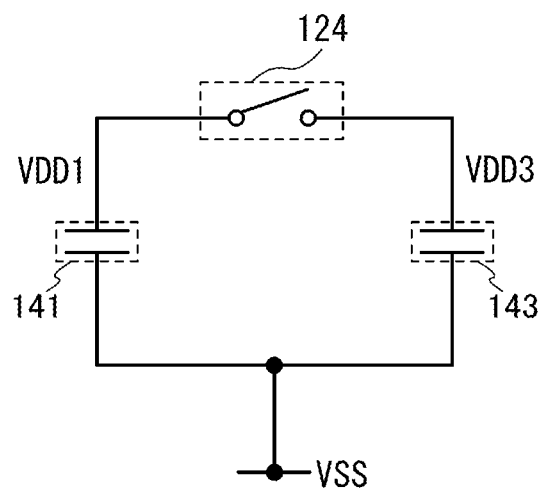
FIGS. 4A and 4B are equivalent circuits which are part of a processor according to one embodiment of the disclosed invention.
Figure 4B:
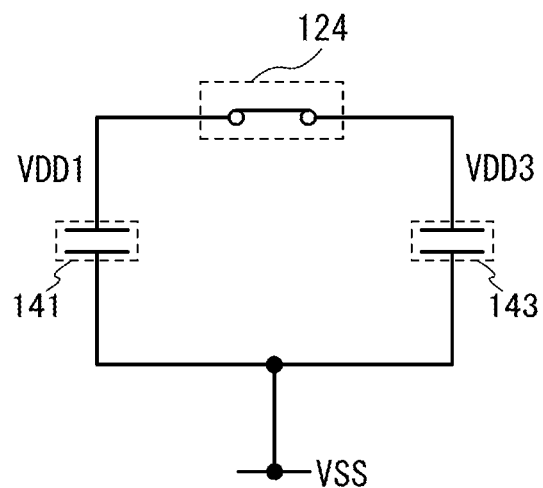

Equivalent circuit diagrams of the first circuit block 101, the third circuit block 103, and the fourth switch 124 in this case are illustrated in FIGS. 4A and 4B. Here, FIG. 4A is an equivalent circuit diagram at the time when the processor proceeds from the arithmetic processing period to the first charge period, and the second switch 122 is turned off and the fourth switch 124 remains off. FIG. 4B illustrates a state where the fourth switch 124 is also turned on and charge is completed.

In FIG. 4A and FIG. 4B, the total capacitor of the first circuit block 101 is referred to as a total capacitor 141 and the total capacitor of the third circuit block 103 is referred to as a total capacitor 143.

When the fourth switch 124 is in an off state and the first high potential power supply line VDD1 and the third high potential power supply line VDD3 are in a non-conduction state as illustrated in FIG. 4A, the potential of the first high potential power supply line VDD1 is defined as H, the potential of the third high potential power supply line VDD3 is defined as L, the capacitance of the total capacitor 141 is defined as C1, and the capacitance of the total capacitor 143 is defined as C3. In that case, each of the potentials V1 of the first high potential power supply line VDD1 and the third high potential power supply line VDD3 in a state where electric charge has been completed as illustrated in FIG. 4B, can be represented by the following formula 1.

$$V_1 = \frac{C_1 H + C_3 L}{C_1 + C_3} \qquad \text{(formula 1)}$$

By charging the third high potential power supply line VDD3 to supply the potential V1 in the first charge period, the potential with which the third high potential power supply line VDD3 is charged in the data storage period becomes H−V1. By performing charging in the first charge period in this manner, the amount of power to be accumulated in the data storage period can be reduced and low power consumption of the processor can be further achieved.

In the data storage period, the first switch 121 and the third switch 123 are set in a conduction state and the second switch 122 and the fourth switch 124 are set in a non-conduction state. Thus, the high potential H of the fourth high potential power supply line VDD is supplied to the second high potential power supply line VDD2 and the third high potential power supply line VDD3. The first high potential power supply line VDD1 is set to the low potential L, the second high potential power supply line VDD2 is set to the high potential H, and the third high potential power supply line VDD3 is set to the high potential H. At this time, in the first high potential power supply line VDD1, the supplied potential V1 is reduced in accordance with leakage current of the first high potential power supply line VDD1.

Since the high potential H is supplied to the second high potential power supply line VDD2 and the third high potential power supply line VDD3, the processor 100 can store data from a volatile memory element of the second circuit block 102 to a nonvolatile memory element of the third circuit block 103. Further, since the first high potential power supply line VDD1 is set to the low potential L and the leakage current from the first high potential power supply line VDD1 is reduced, power consumption of the first circuit block 101 which is not needed in the data storage period can be reduced.

In the power-off period, at least the first switch 121 is set in a non-conduction state. Thus, the high potential H of the fourth high potential power supply line VDD is not supplied to the first high potential power supply line VDD1 to the third high potential power supply line VDD3. The potentials of the first high potential power supply line VDD1 to the third high potential power supply line VDD3 are set to the low potential L. In such a manner, supply of power to at least part of the processor is stopped in a period during which arithmetic processing is not needed in the processor, so that low power consumption of the processor can be achieved.

In the data restorage period, the first switch 121 and the third switch 123 are set in a conduction state and the second switch 122 and the fourth switch 124 are set in a non-conduction state. Thus, the high potential H of the fourth high potential power supply line VDD is supplied to the second high potential power supply line VDD2 and the third high potential power supply line VDD3. The first high potential power supply line VDD1 is set to the low potential L, the second high potential power supply line VDD2 is set to the high potential H, and the third high potential power supply line VDD3 is set to the high potential H.

Since the high potential H is supplied to the second high potential power supply line VDD2 and the third high potential power supply line VDD3, the processor 100 can restore data from the nonvolatile memory element of the third circuit block 103 to the volatile memory element of the second circuit block 102. Further, as in the data storage period, since the first high potential power supply line VDD1 is set to the low potential L and the leakage current from the first high potential power supply line VDD1 is reduced, power consumption of the first circuit block 101 which is not needed in the data restorage period can be reduced.

In the second charge period, the first switch 121 and the fourth switch 124 are set in a conduction state and the second switch 122 and the third switch 123 are set in a non-conduction state. At this time, it is preferable that the third switch 123 change from a conduction state to a non-conduction state before the fourth switch 124 changes from a non-conduction state to a conduction state. Thus, the high potential H of the fourth high potential power supply line VDD is supplied to the second high potential power supply line VDD2. The first high potential power supply line VDD1 and the third high potential power supply line VDD3 become a conduction state and the fourth high potential power supply line VDD and each of the first high potential power supply line VDD1 and the third high potential power supply line VDD 3 become a non-conduction state. Consequently, the first high potential power supply line VDD1 is set to a potential V2, the second high potential power supply line VDD2 is set to the high potential H, and the third high potential power supply line VDD3 is set to the potential V2. Note that in the timing chart in FIG. 3, the potential V2 is equal to the potential V1; however, the potential V2 is not limited thereto.

Since the high potential H is supplied to the second high potential power supply line VDD2, the processor 100 can retain data written again in the volatile memory element of the second circuit block 102 in the second charge period.

Further, in contrast to the first charge period, electric charge from the third high potential power supply line VDD3 can be accumulated in the first high potential power supply line VDD1.

Similarly to the case in the first charge period, when the fourth switch 124 is in an off state and the first high potential power supply line VDD1 and the third high potential power supply line VDD3 are in a non-conduction state, the potential of the first high potential power supply line VDD1 is defined as L, the potential of the third high potential power supply line VDD3 is defined as H, the capacitance of the total capacitor 141 is defined as C1, and the capacitance of the total capacitor 143 is defined as C3. In that case, each of the potentials V2 of the first high potential power supply line VDD1 and the third high potential power supply line VDD3 in a state where electric charge has been completed can be represented by the following formula 2.

$$V_2 = \frac{C_1 L + C_3 H}{C_1 + C_3} \qquad \text{(formula 2)}$$

By charging the first high potential power supply line VDD1 to supply the potential V2 in the second charge period, the potential with which the first high potential power supply line VDD1 is charged in the following arithmetic processing period becomes H−V2. By performing charging in the second charge period in this manner, the amount of power to be accumulated in the following arithmetic processing period can be reduced and low power consumption of the processor can be further achieved.

Next to the second charge period, the processor can operate in the following arithmetic processing period in a manner similar to the above.

In the power-gating driving method described in this embodiment, both the first charge period and the second charge period are provided; however, the disclosed invention is not limited thereto, and either the first charge period or the second charge period may be provided.

For example, since according to the formula 1 and the formula 2, V1≈H and V2≈L in the case where C1>>C3, charging in the first charge period is effective; however, the effect of charging in the second charge period is hardly obtained. Thus, in the case where the total capacitance of the first circuit block 101 is sufficiently larger than that of the third circuit block 103, it is preferable to provide only the first charge period.

In contrast, since according to the formula 1 and the formula 2, $V1 \approx L$ and $V2 \approx H$ in the case where $C3 >> C1$, charging in the second charge period is effective; however, the effect of charging in the first charge period is hardly obtained. Thus, in the case where the total capacitance of the third circuit block 103 is sufficiently larger than that of the first circuit block 101, it is preferable to provide only the second charge period.

By using a power gating driving method in the processor 100 as described above, leakage current from the high potential power supply lines can be reduced. Thus, a processor in which low power consumption is achieved can be provided.

The structures, methods, and the like in this embodiment can be combined with any of the structures, methods, and the like in the other embodiments as appropriate.

Embodiment 2

In this embodiment, an example of a method for manufacturing the processor described in the above embodiment is described with reference to FIGS. 5A to 5D, FIGS. 6A to 6C, FIGS. 7A to 7C, FIGS. 8A and 8B, and FIGS. 9A and 9B. A method for manufacturing the transistor 110 and the transistor 112 in the nonvolatile memory element 133 in FIG. 2B is described. Note that in FIGS. 5A to 5D, FIGS. 6A to 6C, FIGS. 7A to 7C, and FIGS. 8A and 8B, a cross-sectional view taken along line A-B corresponds to a cross-sectional view of a region where the transistor 110 including an oxide semiconductor as a wide band gap semiconductor and the n-channel transistor 112 are formed, and a cross-sectional view taken along line C-D corresponds to a cross-sectional view of a node M1 at which the drain electrode (or the source electrode) of the transistor 110 including an oxide semiconductor film is connected to the gate electrode of the n-channel transistor 112.

Note that the transistor included in the volatile memory element 132 in FIG. 2B can be formed using materials and a method that are similar to those of the transistor 112. In the case where the structure in FIG. 2C is employed, the transistor 113 can also be formed using materials and a method that are similar to those of the transistor 112.

Figure 5A:
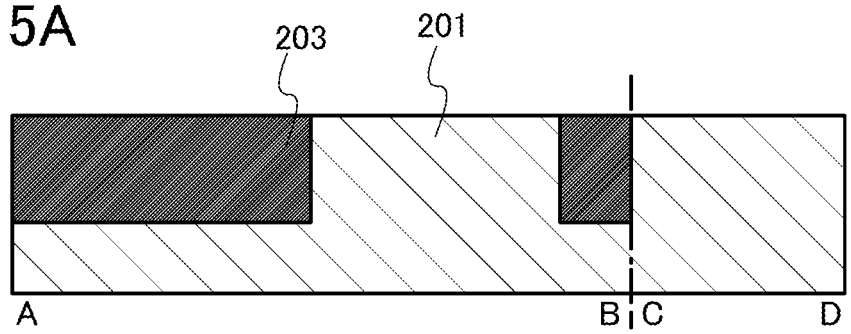
FIGS. 5A to 5D are cross-sectional views illustrating some of steps of manufacturing the processor according to one embodiment of the disclosed invention.

First, as illustrated in FIG. 5A, element isolation regions 203 are formed in a p-type semiconductor substrate 201.

As the p-type semiconductor substrate 201, a single crystal silicon substrate (a silicon wafer) having p-type conductivity, or a compound semiconductor substrate (e.g., a SiC substrate or a GaN substrate) can be used.

Instead of the p-type semiconductor substrate 201, the following substrate may be used as a silicon on insulator (SOI) substrate: a so-called separation by implanted oxygen (SIMOX) substrate which is formed in such a manner that after an oxygen ion is implanted into a mirror-polished wafer, an oxide layer is formed at a certain depth from a surface and defects generated in a surface layer are eliminated by high-temperature heating; or an SOI substrate formed by a technique called a Smart-Cut method in which a semiconductor substrate is cleaved by utilizing the thermally induced growth of a minute void formed by implantation of a hydrogen ion, an epitaxial layer transfer (ELTRAN: a registered trademark of Canon Inc.) method, or the like.

The element isolation region 203 is formed by a local oxidation of silicon (LOCOS) method, a shallow trench isolation (STI) method, or the like.

In the case where a p-channel transistor is formed over the same substrate, an n-well region may be formed in part of the p-type semiconductor substrate 201. The n-well region is formed by addition of an impurity element imparting n-type conductivity, such as phosphorus or arsenic.

Although the p-type semiconductor substrate is used here, a p-channel transistor may be formed using an n-type semiconductor substrate. In that case, a p-well region to which an impurity element imparting p-type conductivity, such as boron, is added may be formed in the n-type semiconductor substrate and an n-channel transistor may be formed over the same substrate.

Figure 5B:
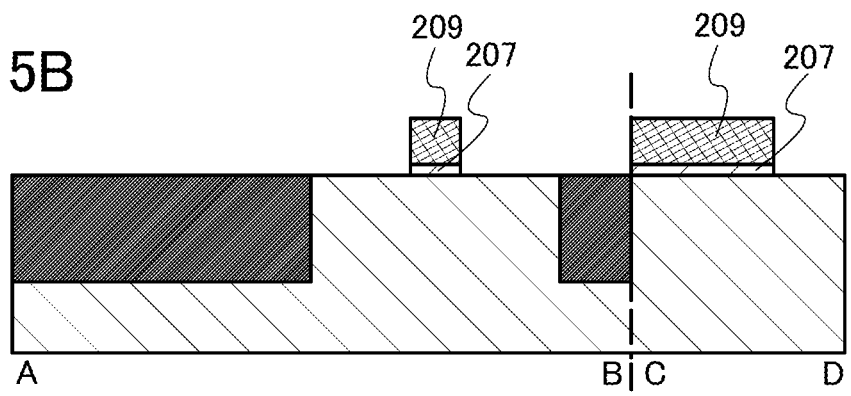

Next, as illustrated in FIG. 5B, a gate insulating film 207 and a gate electrode 209 are formed over the semiconductor substrate 201.

A surface of the semiconductor substrate 201 is oxidized by heat treatment, so that a silicon oxide film is formed. Alternatively, a silicon oxide film is formed by thermal oxidation, and then a surface of the silicon oxide film is nitrided by nitridation treatment; thus a layered structure including the silicon oxide film and a silicon film containing oxygen and nitrogen (silicon oxynitride film) is formed. Next, part of the silicon oxide film or the silicon oxynitride film is selectively etched to form the gate insulating film 207. Alternatively, the gate insulating film 207 is formed in such a manner that silicon oxide, silicon oxynitride, a metal oxide such as a tantalum oxide, hafnium oxide, hafnium silicate oxide, zirconium oxide, aluminum oxide, or titanium oxide, which is a high dielectric constant material (also referred to as a high-k material), a rare-earth oxide such as lanthanum oxide, or the like is formed to a thickness of 5 nm to 50 nm by a CVD method, a sputtering method, or the like, and then part thereof is selectively etched.

The gate electrode 209 is preferably formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Alternatively, the gate electrode 209 may be formed to have a layered structure of a metal nitride film and a film of any of the metals. As a metal nitride, tungsten nitride, molybdenum nitride, or titanium nitride can be used. When the metal nitride film is provided, adhesiveness of the metal film can be increased; thus, separation can be prevented.

The gate electrode 209 is formed in such a manner that a conductive film is formed by a sputtering method, a CVD method, or the like and then part of the conductive film is selectively etched.

Here, the surface of the semiconductor substrate 201 is oxidized by heat treatment to form a silicon oxide film; a conductive film including a stack of a tantalum nitride film and a tungsten film is formed over the silicon oxide film by a sputtering method; and then part of the silicon oxide film and part of the conductive film are selectively etched. Thus, the gate insulating film 207 and the gate electrode 209 are formed.

Note that for high integration, a structure in which a sidewall insulating layer is not provided on a side surface of the gate electrode 209 is preferable. On the other hand, when the characteristics of the transistor have priority, a sidewall insulating layer can be provided on the side surface of the gate electrode 209.

Figure 5C:
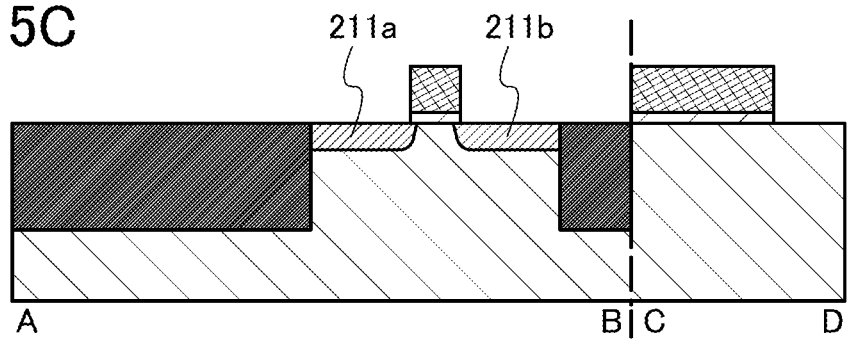

Next, as illustrated in FIG. 5C, an impurity element imparting n-type conductivity is added to the semiconductor substrate 201 to form n-type impurity regions 211a and 211b. In the case where an n-well region is formed in the same substrate, p-type impurity regions are formed by addition of an impurity element imparting p-type conductivity to the n-well region. The concentration of the impurity element imparting n-type conductivity in the n-type impurity regions 211a and 211b and the concentration of the impurity element imparting p-type conductivity in the p-type impurity regions preferably range from $1\times10^{19}$/cm$^3$ to $1\times10^{21}$/cm$^3$. The impurity element imparting n-type conductivity and the impurity element imparting p-type conductivity are added to the semiconductor substrate 201 and the n-well region, respectively, by an ion doping method, an ion implantation method, or the like as appropriate.

In the case where a sidewall insulating layer is provided on the side surface of the gate electrode 209, an impurity region having impurity concentration different from that in the n-type impurity regions 211a and 211b and that in the p-type impurity regions can be formed in a region overlapping with the sidewall insulating layer.

Figure 5D:
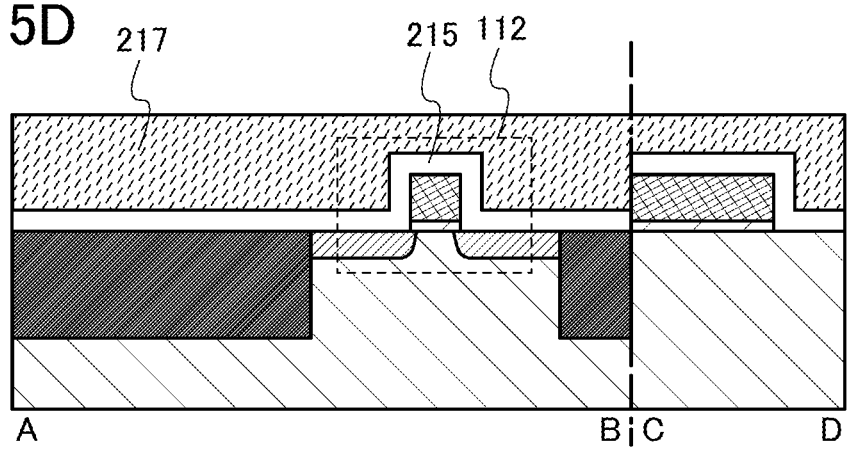

Next, as illustrated in FIG. 5D, an insulating film 215 and an insulating film 217 are formed over the semiconductor substrate 201, the element isolation regions 203, the gate insulating film 207, and the gate electrode 209 by a sputtering method, a CVD method, or the like.

The insulating films 215 and 217 may each be formed to have a single layer or a stack including one or more of silicon oxide, silicon oxynitride, silicon nitride oxide, silicon nitride, aluminum oxide, aluminum oxynitride, aluminum nitride oxide, aluminum nitride, and the like. When the insulating film 215 is formed by a CVD method, the hydrogen content of the insulating film 215 is increased. By performing heat treatment using the insulating film 215, it is possible to hydrogenate the semiconductor substrate, to terminate a dangling bond by hydrogen, and to reduce defects in the semiconductor substrate.

Note that the flatness of the insulating film 217 can be increased when the insulating film 217 is formed using an inorganic material such as boron phosphorus silicate glass (BPSG), or an organic material such as polyimide or acrylic.

After the formation of the insulating film 215 or the insulating film 217, heat treatment is performed to activate the impurity elements added to the n-type impurity regions 211a and 211b and the p-type impurity regions.

Through the above steps, the n-channel transistor 112 can be formed as illustrated in FIG. 5D. Here, the transistor 112 is formed using a semiconductor other than an oxide semiconductor, such as single crystal silicon, so that the transistor 112 can operate at high speed. Accordingly, a memory block of a processor that can achieve high-speed access can be formed.

Next, parts of the insulating films 215 and 217 are selectively etched to form openings. Then, contact plugs 219a and 219b are formed in the openings. Typically, the contact plugs 219a and 219b are formed in such a manner that after a conductive film is formed by a sputtering method, a CVD method, or the like, planarization treatment is performed by a chemical mechanical polishing (CMP) method, etching, or the like so that an unnecessary portion of the conductive film is removed.

The conductive film serving as the contact plugs 219a and 219b is formed in such a manner that tungsten silicide is formed using a WF$_6$ gas and a SiH$_4$ gas by a CVD method to fill the openings.

Next, an insulating film is formed over the insulating film 217 and the contact plugs 219a and 219b by a sputtering method, a CVD method, or the like, and then, part of the insulating film is selectively etched to form an insulating film 221 having a groove portion. Then, after a conductive film is formed by a sputtering method, a CVD method, or the like, planarization treatment is performed by a CMP method, etching, or the like, and an unnecessary portion of the conductive film is removed; thus, wirings 223a and 223b are formed (see FIG. 6A).

The insulating film 221 can be formed using a material that is similar to the material of the insulating film 215.

The wirings 223a and 223b are formed to have a single-layer structure or a layered structure including any of metals such as aluminum, titanium, chromium, nickel, copper, yttrium, zirconium, molybdenum, silver, tantalum, and tungsten and an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is formed over a copper-magnesium-aluminum alloy film, and a three-layer structure in which a titanium film, an aluminum film, and a titanium film are stacked in that order can be given. Note that a transparent conductive material containing indium oxide, tin oxide, or zinc oxide may be used.

Next, an insulating film 220 is formed over the insulating film 221, the wiring 223a, and the wiring 223b by a sputtering method, a CVD method, or the like. An insulating film is formed over the insulating film 220 by a sputtering method, a CVD method, or the like, and then part of the insulating film is selectively etched to form an insulating film 222 having a groove portion. Then, after a conductive film is formed by a sputtering method, a CVD method, or the like, planarization treatment is performed by a CMP method, etching, or the like, and an unnecessary portion of the conductive film is removed; thus, an electrode 224 is formed (see FIG. 6B).

Here, each of the insulating film 220 and the insulating film 222 can be formed using a material that is similar to the material of the insulating film 215. Note that a selectivity ratio of the insulating film 220 with respect to the insulating film 222 is preferably high.

Here, the electrode 224 functions as a back gate electrode of the transistor 110 to be described later. The electrode 224 can control the threshold voltage of the transistor 110. The electrode 224 may be electrically isolated (floating) or may be supplied with a potential from another element. The state of the electrode 224 can be set as appropriate based on control of the threshold voltage of the transistor 110. Note that the material of the electrode 224 can be similar to the material of a gate electrode 233 to be described later.

Note that in this embodiment, the electrode 224 is provided over the wiring 223a and the wiring 223b; however, the present invention is not limited thereto. For example, the electrode 224 may be formed in the same conductive layer as the wiring 223a and the wiring 223b.

Using the insulating film 222 and the electrode 224 which are planarized, variations in electrical characteristics of transistors each including an oxide semiconductor film to be formed later can be reduced. Further, the transistor including an oxide semiconductor film can be formed with a high yield.

Next, heat treatment or plasma treatment is preferably performed so that hydrogen contained in the insulating film 221, the wirings 223a and 223b, the insulating films 220 and 222, and the electrode 224 is released. Consequently, in heat treatment performed later, diffusion of hydrogen into an insulating film and an oxide semiconductor film to be formed later can be prevented. The heat treatment is performed at higher than or equal to 100° C. and lower than the strain point of the substrate in an inert atmosphere, a reduced-pressure atmosphere, or a dry air atmosphere. Further, in the plasma treatment, a rare gas, oxygen, nitrogen, or nitrogen oxide (e.g., nitrous oxide, nitrogen monoxide, or nitrogen dioxide) is used.

Next, an insulating film 225 is formed over the insulating film 222 and the electrode 224 by a sputtering method, a CVD method, or the like. The insulating film 225 can be formed to have a single layer or a stack including one or more of silicon oxide, silicon oxynitride, silicon nitride oxide, gallium oxide, hafnium oxide, yttrium oxide, aluminum oxide, and aluminum oxynitride. The insulating film 225 is preferably formed using an oxide insulating film from which part of oxygen is released by heating. The oxide insulating film from which part of oxygen is released by heating is an oxide insulating film that contains oxygen at a proportion exceeding the stoichiometric proportion. Oxygen is released by heating from the oxide insulating film from which part of oxygen is released by heating; thus, oxygen can be diffused into the oxide semiconductor film by heating performed in a later step.

In the case where the insulating film 225 has a layered structure, a lower insulating film of the insulating film 225 is preferably an insulating film serving as a barrier film that prevents entry of an impurity that diffuses from a lower layer. In particular, in the case where a single crystal silicon substrate, an SOI substrate, a substrate over which a semiconductor element formed using silicon or the like is provided, or the like is used as the semiconductor substrate 201, hydrogen or the like contained in the substrate can be prevented from being diffused and entering the oxide semiconductor film to be formed later. As such an insulating film, for example, a silicon nitride film, a silicon nitride oxide film, or an aluminum oxide film formed by a plasma-enhanced CVD method, a sputtering method, or the like can be used.

The insulating film 225 is preferably planarized by CMP treatment or the like. A surface of the insulating film 225 has an average surface roughness (Ra) of 1 nm or less, preferably 0.3 nm or less, more preferably 0.1 nm or less.

Note that in this specification and the like, the average surface roughness (Ra) is obtained by expanding arithmetic mean surface roughness (Ra), which is defined by JIS B 0601:2001 (ISO4287:1997), into three dimensions so as to be applied to a curved surface, and is an average value of the absolute values of deviations from a reference surface to a specific surface.

When the specific surface which is a surface represented by measurement data is expressed as Z=F(X,Y), the average surface roughness (Ra) is an average value of the absolute values of deviations from the reference surface to the specific surface and is shown by the following formula.

$$Ra = \frac{1}{S_0} \int_{y_1}^{y_2} \int_{x_1}^{x_2} |f(x, y) - Z_0| \, dx \, dy$$

The specific surface is a surface which is a target of roughness measurement, and is a quadrilateral region which is specified by four points represented by the coordinates $(x_1, y_1, f(x_1, y_1))$, $(x_1, y_2, f(x_1, y_2))$, $(x_2, y_1, f(x_2, y_1))$, and $(x_2, y_2, f(x_2, y_2))$. Here, $S_0$ represents the area of a rectangle which is obtained by projecting the specific surface on the xy plane, and $Z_0$ represents the height of the reference surface (the average height of the specific surface). Ra can be measured using an atomic force microscope (AFM).

The CMP treatment may be performed once or plural times. When the CMP treatment is performed plural times, first polishing is preferably performed with a high polishing rate followed by final polishing with a low polishing rate. By performing polishing steps with different polishing rates in combination, the planarity of the surface of the insulating film 225 can be further increased.

Alternatively, plasma treatment can be used as the planarization treatment of the insulating film 225. The plasma treatment is performed in such a manner that an inert gas, for example, a rare gas such as an argon gas is introduced into a vacuum chamber and an electric field is applied so that a surface to be processed serves as a cathode. The plasma treatment has a principle similar to that of plasma dry etching and an inert gas is used in the plasma treatment. In other words, the plasma treatment is treatment in which the surface to be processed is irradiated with ions of an inert gas and minute unevenness of the surface is reduced by a sputtering effect. Thus, the plasma treatment can also be referred to as "reverse sputtering treatment".

When the plasma treatment is performed, electrons and argon cations are present in plasma and the argon cations are accelerated in a cathode direction. The surface to be processed is sputtered by the accelerated argon cations. At this time, a projected portion of the surface to be processed is preferentially sputtered. Particles generated by sputtering from the surface to be processed attach to another place of the surface to be processed. At this time, the particles generated by sputtering from the surface to be processed preferentially attach to a depression of the surface to be processed. By thus reducing the projected portion and filling the depression, the planarity of the surface to be processed is increased. Note that a combination of plasma treatment and CMP treatment can further planarize the insulating film 225.

Note that through the plasma treatment, it is possible to remove impurities such as oxygen, moisture, and an organic compound that attach to the surface of the insulating film 225 by a sputtering effect.

It is preferable that impurities such as hydrogen, water, a hydroxyl group, and hydride in a deposition chamber be removed by heating and evacuation of the deposition chamber before formation of an oxide semiconductor. It is particularly important to remove such impurities adsorbed on an inner wall of the deposition chamber. Here, heat treatment may be performed at 100° C. to 450° C. Evacuation of the deposition chamber is preferably performed with a rough vacuum pump, such as a dry pump, and a high vacuum pump, such as a sputter ion pump, a turbo molecular pump, or a cryopump, in appropriate combination. The turbo molecular pump has high capability in evacuating a large molecule, whereas it has low capability in evacuating hydrogen or water. Further, a combination with a cryopump having high capability in evacuating water or a sputter ion pump having high capability in evacuating hydrogen is effective. At this time, when the impurities are removed while an inert gas is introduced, the rate of elimination of water or the like, which is difficult to eliminate only by evacuation, can be further increased. Removal of impurities in the deposition chamber by such treatment before the formation of the oxide semiconductor can prevent hydrogen, water, a hydroxyl group, hydride, and the like from entering the oxide semiconductor.

Before the oxide semiconductor film is formed by a sputtering apparatus, a dummy substrate may be put into the sputtering apparatus, and an oxide semiconductor film may be formed over the dummy substrate, so that hydrogen and moisture that attach to the target surface or a deposition shield may be removed.

Figure 6A:
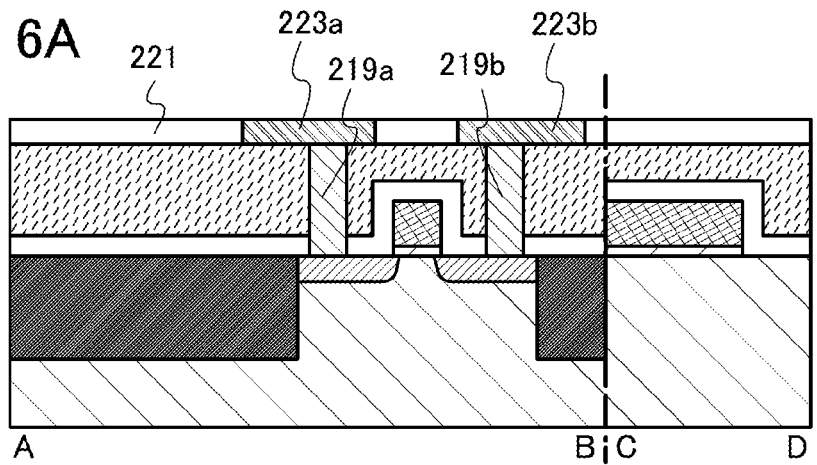
FIGS. 6A to 6C are cross-sectional views illustrating some of steps of manufacturing the processor according to one embodiment of the disclosed invention.
Figure 6B:
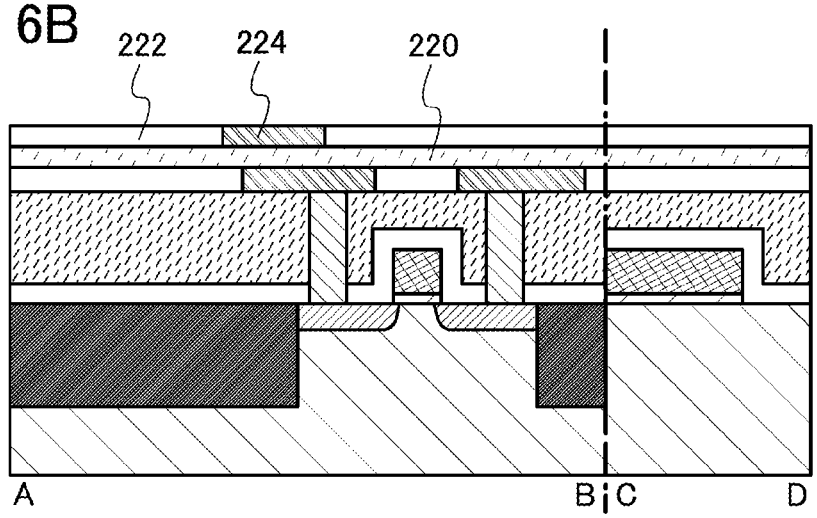
Figure 6C:
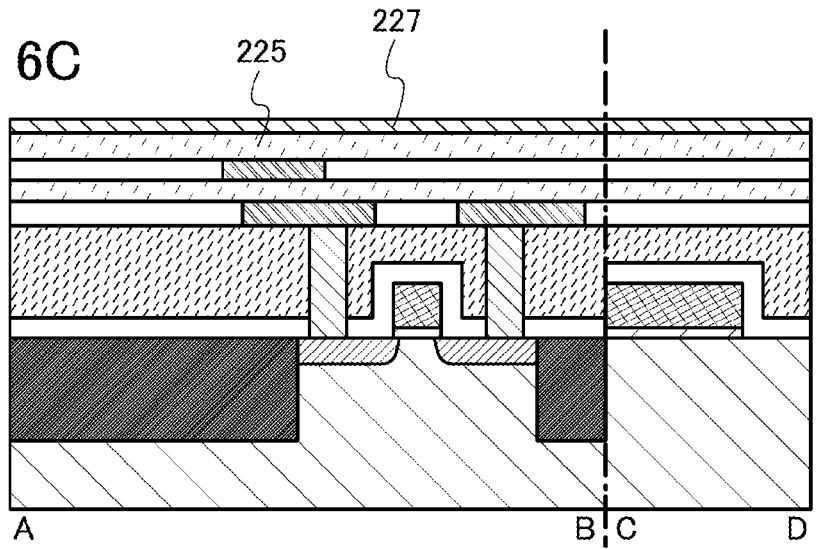

Next, an oxide semiconductor film 227 is formed over the insulating film 225 by a sputtering method, a coating method, a printing method, an evaporation method, a PCVD method, a PLD method, an ALD method, an MBE method, or the like (see FIG. 6C). Here, as the oxide semiconductor film 227, an oxide semiconductor film having a thickness of 1 nm to 50 nm, preferably 3 nm to 20 nm is formed by a sputtering method. When the oxide semiconductor film 227 has a thickness in the above range, a short-channel effect which might be caused due to downsizing of the transistor can be suppressed.

An oxide semiconductor used for the oxide semiconductor film 227 preferably contains at least indium (In) or zinc (Zn). In particular, the oxide semiconductor preferably contains In and Zn. As a stabilizer for reducing variations in electrical characteristics of a transistor including the oxide semiconductor, the oxide semiconductor preferably contains gallium (Ga) in addition to In and Zn. Tin (Sn) is preferably contained as a stabilizer. Hafnium (Hf) is preferably contained as a stabilizer.

As another stabilizer, one or more kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide, tin oxide, zinc oxide, an In—Zn-based oxide, a Sn—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Sn—Zn-based oxide, a Sn—Ga—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, or an In—Sn—Hf—Zn-based oxide. Here, for example, an In—Ga—Zn-based oxide means an oxide containing indium (In), gallium (Ga), and zinc (Zn) as its main components and there is no particular limitation on the ratio of In:Ga:Zn. The In—Ga—Zn-based oxide may contain a metal element other than the In, Ga, and Zn. In this case, the amount of oxygen in the oxide semiconductor preferably exceeds the stoichiometric proportion. When the amount of oxygen exceeds the stoichiometric proportion, generation of carriers which results from oxygen vacancies in the oxide semiconductor film can be suppressed.

Alternatively, a material represented by $InMO_3(ZnO)_m$ (m>0, where m is not an integer) may be used as the oxide semiconductor. Note that M represents one or more metal elements selected from Ga, Fe, Mn, and Co. Alternatively, as the oxide semiconductor, a material represented by $In_2SnO_5(ZnO)_n$ (n>0, where n is an integer) may be used.

Note that the concentration of alkali metals or alkaline earth metals in the oxide semiconductor film 227 is preferably $1\times10^{18}$ atoms/cm$^3$ or lower, more preferably $2\times10^{16}$ atoms/cm$^3$ or lower. When an alkali metal or an alkaline earth metal is bonded to an oxide semiconductor, carriers are generated in some cases, which causes an increase in off-state current of the transistor.

The oxide semiconductor film 227 may contain nitrogen at $5\times10^{18}$ atoms/cm$^3$ or lower.

As an oxide semiconductor which can be used for the oxide semiconductor film 227, a wide band gap semiconductor which has a wider band gap and lower intrinsic carrier density than a silicon semiconductor is used. The band gap of the wide band gap oxide semiconductor is 2.5 eV to 4 eV, preferably 3 eV to 3.8 eV. The off-state current of a transistor can be reduced by using an oxide semiconductor having a wide energy gap.

The oxide semiconductor film 227 may have a single crystal structure or a non-single-crystal structure. In the latter case, the oxide semiconductor film 227 may have an amorphous structure or a polycrystalline structure. Further, the oxide semiconductor film 227 may have an amorphous structure including a crystalline portion or a non-amorphous structure.

In an oxide semiconductor in an amorphous state, a flat surface can be obtained with relative ease, so that when a transistor is formed with the use of the oxide semiconductor, interface scattering can be reduced, and comparatively high mobility can be obtained with relative ease.

In a crystalline oxide semiconductor, defects in a bulk can be further reduced and when surface flatness is improved, mobility higher than that of an oxide semiconductor in an amorphous state can be obtained. In order to improve the surface flatness, the oxide semiconductor is preferably formed over a flat surface. As described above, the average surface roughness (Ra) of the surface of the insulating film 225 is 1 nm or less, preferably 0.3 nm or less, more preferably 0.1 nm or less, and the oxide semiconductor film 227 is preferably formed over the insulating film 225.

Here, the oxide semiconductor film 227 is formed by a sputtering method. As a target, a target corresponding to the oxide can be used.

In the case where an In—Ga—Zn—O-based material is used as the oxide semiconductor, the target can be formed as appropriate in accordance with the material and composition of the oxide semiconductor film 227. For example, an In—Ga—Zn-based oxide with an atomic ratio of In:Ga:Zn=1:1:1, In:Ga:Zn=1:3:2, In:Ga:Zn=3:1:2, or In:Ga:Zn=2:1:3, or an oxide whose composition is in the neighborhood of the above compositions is preferably used as the target. However, the material and composition of the target are not limited to the above.

However, without limitation to the materials given above, a material with an appropriate composition may be used depending on needed semiconductor characteristics (e.g., mobility, threshold voltage, and variation). In order to obtain the needed semiconductor characteristics, it is preferable that the carrier concentration, the impurity concentration, the defect density, the atomic ratio between a metal element and oxygen, the interatomic distance, density, and the like be set to appropriate values. Alternatively, oxide semiconductor films which have different constitutions (typified by composition) may be stacked or may be separately provided as a channel formation region and source and drain regions as appropriate.

As a sputtering gas, a rare gas (typically argon) atmosphere, an oxygen atmosphere, or a mixed gas of a rare gas and oxygen is used as appropriate. In the case of the mixed gas of a rare gas and oxygen, the proportion of oxygen is preferably higher than that of a rare gas. Further, in order to prevent hydrogen, water, a hydroxyl group, hydride, and the like from entering the oxide semiconductor film, as a sputtering gas, it is preferable to use a high-purity gas from which impurities such as hydrogen, water, a hydroxyl group, and hydride are sufficiently removed.

In a sputtering method, an RF power source, an AC power source, a DC power source, or the like can be used as a power source for generating plasma as appropriate.

Note that the leakage rate of a deposition chamber in which the oxide semiconductor film is formed is preferably $1\times10^{-10}$ Pa·m$^3$/s or lower so that entry of an impurity into a film to be formed by a sputtering method can be reduced. As described above, in the process for forming the oxide semiconductor film and preferably in the process for forming the oxide insulating film, entry of impurities is suppressed as much as possible through control of the pressure of the deposition chamber, the leakage rate of the deposition chamber, and the like. Thus, entry of impurities including hydrogen into the oxide semiconductor film can be reduced. In addition, diffusion of impurities such as hydrogen from the oxide insulating film into the oxide semiconductor film can be reduced.

The oxide semiconductor film 227 may be in a non-single-crystal state, for example. The non-single-crystal state is, for example, structured by at least one of c-axis aligned crystal (CAAC), polycrystal, microcrystal, and an amorphous part.

The oxide semiconductor film 227 may include CAAC. Note that an oxide semiconductor including CAAC is referred to as a CAAC-OS (c-axis aligned crystalline oxide semiconductor). The CAAC-OS is not absolutely amorphous.

In an image obtained with a transmission electron microscope (TEM), for example, crystal parts can be found in the CAAC-OS in some cases. Note that in most cases, a crystal part in the CAAC-OS fits inside a cube whose one side is 100 nm in an image obtained with the TEM, for example. In an image obtained with the TEM, a boundary between the crystal parts is not clearly detected in some cases. Further, in an image obtained with the TEM, a grain boundary in the CAAC-OS might not be found. In the CAAC-OS which does not have a clear boundary, for example, segregation of an impurity, an increase in the density of defect states, and a reduction in electron mobility hardly occur.

For example, the CAAC-OS includes a plurality of crystal parts. In the plurality of crystal parts, c-axes are aligned in a direction parallel to a normal vector of a surface where the CAAC-OS is formed or a normal vector of a surface of the CAAC-OS in some cases. When the CAAC-OS is analyzed by an out-of-plane method with an X-ray diffraction (XRD) apparatus, a peak at $2\theta$ of around 31 degrees which shows alignment appears in some cases. Further, for example, spots (luminescent spots) are shown in an electron diffraction image of the CAAC-OS in some cases. An electron diffraction image obtained with an electron beam having a beam diameter of 10 nmq) or smaller, or 5 nmq) or smaller, is called a nanobeam electron diffraction image. In the CAAC-OS, for example, among crystal parts, the directions of the a-axis and the b-axis of one crystal part are different from those of another crystal part, in some cases. In the CAAC-OS, for example, c-axes are aligned, and a-axes and/or b-axes are not macroscopically aligned, in some cases.

In each of the crystal parts included in the CAAC-OS, for example, a c-axis is aligned in a direction parallel to a normal vector of a surface where the CAAC-OS is formed or a normal vector of a surface of the CAAC-OS. Further, in each of the crystal parts, metal atoms are arranged in a triangular or hexagonal configuration when seen from the direction perpendicular to the a-b plane, and metal atoms are arranged in a layered manner or metal atoms and oxygen atoms are arranged in a layered manner when seen from the direction perpendicular to the c-axis. Note that among crystal parts, the directions of the a-axis and the b-axis of one crystal part may be different from those of another crystal part. In this specification, the term "perpendicular" includes a range from 80° to 100°, preferably from 85° to 95°. In addition, the term "parallel" includes a range from −10° to 10°, preferably from −5° to 5°.

Further, the CAAC-OS can be formed by reducing the density of defect states for example. In an oxide semiconductor, for example, oxygen vacancies cause an increase in the density of defect states. The oxygen vacancies serve as carrier traps or serve as carrier generation sources when hydrogen is captured therein. In order to form the CAAC-OS, for example, it is important to prevent oxygen vacancies from being generated in the oxide semiconductor. Thus, the CAAC-OS is an oxide semiconductor having a low density of defect states. In other words, the CAAC-OS is an oxide semiconductor having few oxygen vacancies.

The state in which impurity concentration is low and density of defect states is low (the number of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, in some cases, a transistor including the oxide semiconductor in a channel formation region rarely has a negative threshold voltage (is rarely normally-on). A highly purified intrinsic or substantially highly purified intrinsic oxide semiconductor has a low density of defect states and accordingly has few carrier traps in some cases. Thus, the transistor including the oxide semiconductor in the channel formation region has a small variation in electrical characteristics and high reliability in some cases. An electric charge trapped by the carrier traps in the oxide semiconductor takes a long time to be released. The trapped electric charge may behave like a fixed electric charge. Thus, the transistor which includes the oxide semiconductor having a high density of defect states in the channel formation region has unstable electrical characteristics in some cases.

With the use of the high purified intrinsic or substantially highly purified intrinsic CAAC-OS in a transistor, variation in the electrical characteristics of the transistor due to irradiation with visible light or ultraviolet light is small.

The oxide semiconductor film 227 may include polycrystal, for example. Note that an oxide semiconductor including polycrystal is referred to as a polycrystalline oxide semiconductor. A polycrystalline oxide semiconductor includes a plurality of crystal grains. A polycrystalline oxide semiconductor includes, for example, amorphous parts in some cases.

For example, the oxide semiconductor film 227 may include microcrystal. Note that an oxide semiconductor including microcrystal is referred to as a microcrystalline oxide semiconductor. A microcrystalline oxide semiconductor is not absolutely amorphous.

In an image obtained with the TEM, for example, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm, for example. A microcrystal with a size greater than or equal to 1 nm and less than or equal to 10 nm is specifically referred to as nanocrystal (nc), for example. An oxide semiconductor including nanocrystal is referred to as an nc-OS (nanocrystalline oxide semiconductor). In an image of the nc-OS obtained with the TEM, a boundary between crystal parts is not clearly detected in some cases. In the nc-OS which does not have a clear boundary, for example, segregation of an impurity, an increase in the density of defect states, and a reduction in electron mobility hardly occur.

In the nc-OS, for example, a microscopic region (for example, a region with a size greater than or equal to 1 nm and less than or equal to 10 nm) has a periodic atomic order occasionally. Further, for example, in the nc-OS, crystal parts are not regularly-arranged. Thus, there is a case where periodic atomic order is not observed microscopically or a case where long-range order in atomic arrangement is not observed. Accordingly, in some cases, the nc-OS cannot be distinguished from an amorphous oxide semiconductor, for example, depending on an analysis method. When the nc-OS film is analyzed by an out-of-plane method with an XRD apparatus using an X-ray having a beam diameter larger than that of a crystal part, a peak which shows alignment does not appear in some cases. Further, for example, a halo pattern is shown in some cases in an electron diffraction image of the nc-OS obtained by using an electron beam having a beam diameter larger than that of a crystal part (for example, a beam diameter of 20 nmϕ or more, or 50 nmϕ or more). For example, spots are shown in some cases in a nanobeam electron diffraction image of the nc-OS obtained by using an electron beam having a beam diameter smaller than or equal to that of a crystal part (for example, a beam diameter of 10 nmϕ or less, or 5 nmϕ or less). In a nanobeam electron diffraction image of the nc-OS, for example, regions with high luminance in a circular pattern are shown in some cases. In a nanobeam electron diffraction image of the nc-OS, for example, a plurality of spots is shown in the region in some cases. Since the microscopic region in the nc-OS has a periodic atomic order occasionally, the nc-OS has lower density of defect states than the amorphous oxide semiconductor. Note that since crystal parts in the nc-OS are not regularly-arranged, the nc-OS has higher density of defect states than the CAAC-OS.

Note that the oxide semiconductor film 227 may be a mixed film including two or more of a CAAC-OS, a polycrystalline oxide semiconductor, a microcrystalline oxide semiconductor, and an amorphous oxide semiconductor. The mixed film includes two or more of an amorphous oxide semiconductor region, a microcrystalline oxide semiconductor region, a polycrystalline oxide semiconductor region, and a CAAC-OS region in some cases. The mixed film has a stacked-layer structure of two or more of an amorphous oxide semiconductor region, a microcrystalline oxide semiconductor region, a polycrystalline oxide semiconductor region, and a CAAC-OS region in some cases.

After the oxide semiconductor film 227 is formed, the oxide semiconductor film 227 may be subjected to heat treatment (first heat treatment). The heat treatment can further remove a substance including a hydrogen atom in the oxide semiconductor film 227; thus, the structure of the oxide semiconductor film 227 can be improved and defect states in the energy gap can be reduced. The heat treatment is performed in an inert gas atmosphere at higher than or equal to 300° C. and lower than or equal to 700° C., preferably higher than or equal to 450° C. and lower than or equal to 600° C., or lower than the strain point of the substrate in the case where the substrate has the strain point. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is 6N (99.9999%) or higher, preferably 7N (99.99999%) or higher (that is, the impurity concentration is 1 ppm or lower, preferably 0.1 ppm or lower).

The heat treatment can be performed in such a manner that, for example, the semiconductor substrate 201 is introduced into an electric furnace using a resistance heating element or the like and heated at 450° C. for an hour in a nitrogen atmosphere.

The heat treatment apparatus is not limited to the electric furnace and may be an apparatus for heating an object by thermal conduction or thermal radiation from a medium such as a heated gas. For example, a rapid thermal anneal (RTA) apparatus such as a lamp rapid thermal anneal (LRTA) apparatus or a gas rapid thermal anneal (GRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object by heat treatment, such as nitrogen, or a rare gas such as argon is used. Note that in the case where a GRTA apparatus is used as the heat treatment apparatus, the substrate may be heated in an inert gas heated to a high temperature of 650° C. to 700° C. because the heat treatment time is short.

In addition, it is preferable that after the oxide semiconductor film 227 is heated by the heat treatment, a high-purity oxygen gas, a high-purity $N_2O$ gas, or ultra dry air (the moisture concentration is 20 ppm (−55° C. by conversion into a dew point) or lower, preferably 1 ppm or lower, more preferably 10 ppb or lower, in the case where measurement is performed by a dew point meter of a cavity-ring down laser spectroscopy (CRDS) method) be introduced into the same furnace. It is particularly preferable that water, hydrogen, and the like be not contained in these gases. The purity of the oxygen gas or the $N_2O$ gas that is introduced into the same furnace is preferably 6N or higher, more preferably 7N or higher (i.e., the impurity concentration in the oxygen gas or the $N_2O$ gas is 1 ppm or lower, preferably 0.1 ppm or lower). By the action of the oxygen gas or the $N_2O$ gas, oxygen which is one of main components of the oxide semiconductor and which has been reduced through the step of removing impurities by dehydration or dehydrogenation can be supplied.

The heat treatment has an effect of removing hydrogen, water, and the like and can be referred to as dehydration, dehydrogenation, or the like. The heat treatment can be performed at timing, for example, before the oxide semiconductor layer is processed to have an island shape or after the gate insulating film is formed. Such heat treatment for dehydration or dehydrogenation may be performed once or plural times.

Next, part of the oxide semiconductor film 227 is selectively etched, so that an oxide semiconductor film 229 is formed to overlap with the electrode 224. Then, an insulating film 231 is formed over the oxide semiconductor film 229 by a sputtering method, a CVD method, or the like. After that, a gate electrode 233 is formed over the insulating film 231 (see FIG. 7A).

A high-density plasma-enhanced CVD using microwaves (e.g., with a frequency of 2.45 GHz) is preferably employed for forming the insulating film 231 serving as a gate insulating film because an insulating layer can be dense and can have high breakdown voltage and high quality. This is because when a highly purified oxide semiconductor is closely in contact with a high-quality gate insulating film, the interface state can be reduced and interface properties can be favorable.

The insulating film 231 may be formed to have a single layer or a stack including one or more of silicon oxide, silicon oxynitride, silicon nitride oxide, silicon nitride, aluminum oxide, hafnium oxide, gallium oxide, a Ga—Zn—O-based metal oxide, and the like. The insulating film 231 may be an oxide insulating film from which oxygen is released by heating, such as a film that can be used as the insulating film 225. By using a film from which oxygen is released by heating as the insulating film 231, oxygen vacancies caused in the oxide semiconductor film 229 can be reduced by heat treatment performed later and deterioration of electrical characteristics of the transistor can be suppressed.

When the insulating film 231 is formed using a high-k material such as hafnium silicate ($HfSiO_x$), hafnium silicate to which nitrogen is added ($HfSiO_xO_yN_z$), hafnium aluminate to which nitrogen is added ($HfAl_xO_yN_z$), hafnium oxide, or yttrium oxide, gate leakage current can be reduced even when the thickness of the gate insulating film is small.

The thickness of the insulating film 231 is preferably 1 nm to 300 nm, more preferably 5 nm to 50 nm, still more preferably 10 nm to 30 nm.

The gate electrode 233 can be formed using a metal element selected from aluminum, chromium, copper, tantalum, titanium, molybdenum, and tungsten; an alloy containing any of these metal elements as its component; an alloy containing these metal elements in combination; or the like. Further, one or more metal elements selected from manganese and zirconium may be used. The gate electrode 233 may have a single-layer structure or a layered structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, a three-layer structure in which a titanium film, an aluminum film, and a titanium film are stacked in that order, and the like can be given. Alternatively, a film, an alloy film, or a nitride film which contains aluminum and one or more elements selected from titanium, tantalum, tungsten, molybdenum, chromium, neodymium, and scandium may be used.

Alternatively, the gate electrode 233 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a layered structure including the light-transmitting conductive material and the metal element.

The gate electrode 233 is formed by a printing method or an inkjet method. Alternatively, the gate electrode 233 is formed in such a manner that a conductive film is formed by a sputtering method, a CVD method, an evaporation method, or the like and then part of the conductive film is selectively etched.

Further, as a material layer that is in contact with the insulating film 231, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (e.g., InN or ZnN) is preferably provided between the gate electrode 233 and the insulating film 231. These films each have a work function of 5 eV or higher, preferably 5.5 eV or higher; thus, the threshold voltage of the transistor can be positive. Accordingly, a so-called normally-off switching element can be obtained. For example, in the case where an In—Ga—Zn—O film containing nitrogen is used, an In—Ga—Zn—O film having nitrogen concentration at least higher than that of the oxide semiconductor film 229, specifically, an In—Ga—Zn—O film having nitrogen concentration of 7 at. % or higher is used.

After that, heat treatment is preferably performed. Through this heat treatment, oxygen can be diffused from the insulating film 225 and the insulating film 231 into the oxide semiconductor film 229 to repair oxygen defects in the oxide semiconductor film 229; thus, the oxygen defects can be reduced.

Note that after the insulating film 231 is formed, heat treatment (second heat treatment) may be performed in an inert gas atmosphere or an oxygen atmosphere. The heat treatment temperature is preferably 200° C. to 450° C., more preferably 250° C. to 350° C. With such heat treatment, variations in electrical characteristics of the transistors can be reduced. In the case where oxygen is contained in the insulating film 231 or the insulating film 225 which is in contact with the oxide semiconductor film 229, oxygen can be supplied to the oxide semiconductor film 229 and the oxygen defects in the oxide semiconductor film 229 can be repaired. As described above, the heat treatment has an effect of supplying oxygen; thus, the heat treatment can also be referred to as supply of oxygen.

Note that in this embodiment, the heat treatment for supply of oxygen is performed after the insulating film 231 is formed; however, the timing of the heat treatment for supply of oxygen is not limited thereto, and the heat treatment may be performed after formation of the insulating film 231 as appropriate.

As described above, the heat treatment for dehydration or dehydrogenation and the heat treatment for supply of oxygen are performed to reduce impurities and fill oxygen vacancies in the oxide semiconductor film 229, whereby the oxide semiconductor film 229 can be highly purified so as to contain impurities other than main components of the oxide semiconductor film 229 as little as possible.

Figure 7A:
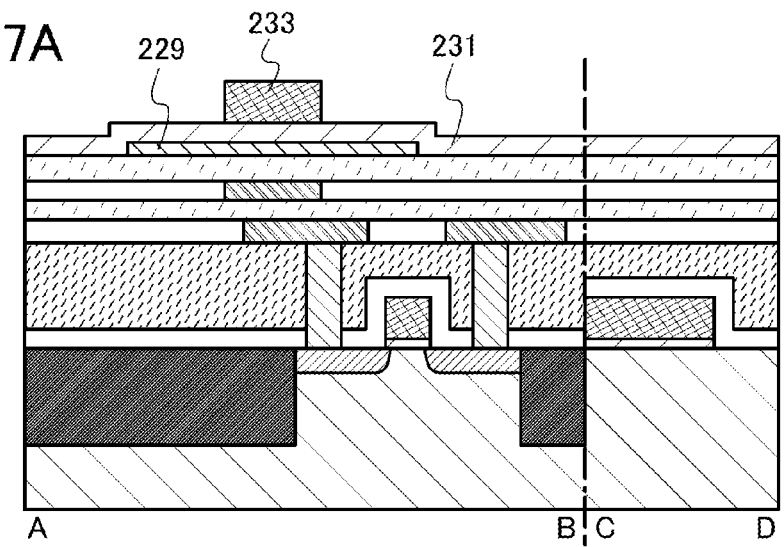
FIGS. 7A to 7C are cross-sectional views illustrating some of steps of manufacturing the processor according to one embodiment of the disclosed invention.
Figure 7B:
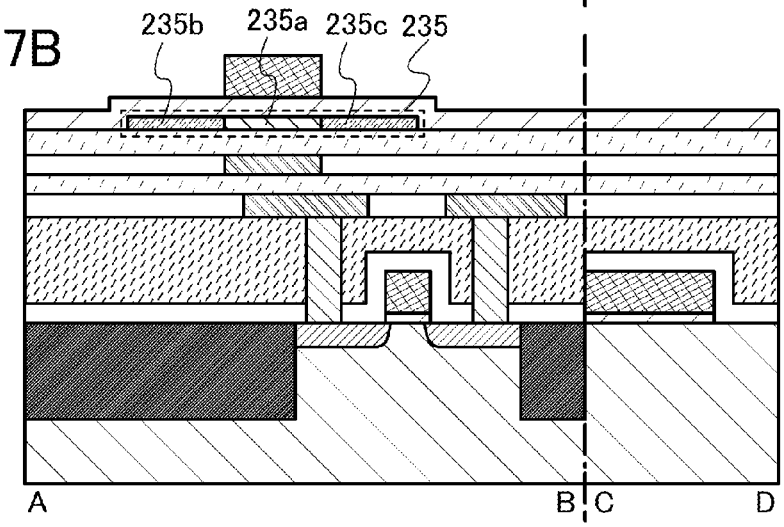

Next, a dopant is added to the oxide semiconductor film 229 with the use of the gate electrode 233 as a mask. As a result, a first region 235a which is covered with the gate electrode 233 and does not contain the dopant and a pair of second regions 235b and 235c which contain the dopant are formed as illustrated in FIG. 7B. Since the dopant is added with the use of the gate electrode 233 as a mask, the first region 235a to which the dopant is not added and the pair of second regions 235b and 235c containing the dopant can be formed in a self-aligning manner. Note that the first region 235a overlapping with the gate electrode 233 functions as a channel region. The pair of second regions 235b and 235c containing the dopant functions as electric-field relaxation regions. The first region 235a and the pair of second regions 235b and 235c containing the dopant constitute an oxide semiconductor film 235.

Further, the concentration of hydrogen in the first region 235a of the oxide semiconductor film 229 is preferably lower than $5\times10^{18}$ atoms/cm$^3$, more preferably lower than or equal to $1\times10^{18}$ atoms/cm$^3$, still more preferably lower than or equal to $5\times10^{17}$ atoms/cm$^3$, further more preferably lower than or equal to $1\times10^{16}$ atoms/cm$^3$. By the bond of an oxide semiconductor and hydrogen, part of hydrogen serves as a donor to generate electrons as carriers. For that reason, by a reduction in concentration of hydrogen in the first region 235a of the oxide semiconductor film 229, a negative shift in the threshold voltage can be reduced.

The concentration of the dopant in the pair of second regions 235b and 235c is higher than or equal to $5\times10^{18}$ atoms/cm$^3$ and lower than or equal to $1\times10^{22}$ atoms/cm$^3$, preferably higher than or equal to $5\times10^{18}$ atoms/cm$^3$ and lower than $5\times10^{19}$ atoms/cm$^3$.

Since the pair of second regions 235b and 235c contains the dopant, the carrier density or the number of defects can be increased. Thus, the conductivity can be higher than that of the first region 235a which does not contain a dopant. Note that an excessive increase in concentration of the dopant causes inhibition of carrier movement by the dopant, which leads to a reduction in conductivity of the pair of second regions 235b and 235c containing the dopant.

The pair of second regions 235b and 235c containing the dopant preferably has a conductivity of higher than or equal to 0.1 S/cm and lower than or equal to 1000 S/cm, preferably higher than or equal to 10 S/cm and lower than or equal to 1000 S/cm.

Since the oxide semiconductor film 229 has the pair of second regions 235b and 235c containing the dopant, an electric field applied to an end portion of the first region 235a serving as the channel region can be relaxed. Thus, a short-channel effect of the transistor can be suppressed.

As a method for adding the dopant to the oxide semiconductor film 229, an ion doping method or an ion implantation method can be used. As the dopant, at least one of boron, nitrogen, phosphorus, and arsenic can be added. Alternatively, as the dopant, at least one of helium, neon, argon, krypton, and xenon can be added. Alternatively, as the dopant, hydrogen can be added. As the dopant, at least one of boron, nitrogen, phosphorus, and arsenic and at least one of helium, neon, argon, krypton, and xenon in appropriate combination with hydrogen can be added.

Although the dopant is added to the oxide semiconductor film 229 in a state where the oxide semiconductor film 229 is covered with the insulating film and the like, the dopant may be added in a state where the oxide semiconductor film 229 is exposed.

Alternatively, the dopant can be added by a method other than an ion doping method, an ion implantation method, or the like. For example, the dopant can be added in the following manner: plasma is generated in an atmosphere of a gas containing an element to be added and plasma treatment is performed on an object to which the dopant is added. A dry etching apparatus, a CVD apparatus, a high-density plasma-enhanced CVD apparatus, or the like can be used to generate the plasma.

After that, heat treatment may be performed. The heat treatment is performed typically at a temperature higher than or equal to 150° C. and lower than or equal to 450° C., preferably higher than or equal to 250° C. and lower than or equal to 325° C. In the heat treatment, the temperature may be gradually increased from 250° C. to 325° C.

Through the heat treatment, the resistance of the pair of second regions 235b and 235c containing the dopant can be reduced. In the heat treatment, the pair of second regions 235b and 235c containing the dopant may be crystalline or amorphous.

Figure 7C:
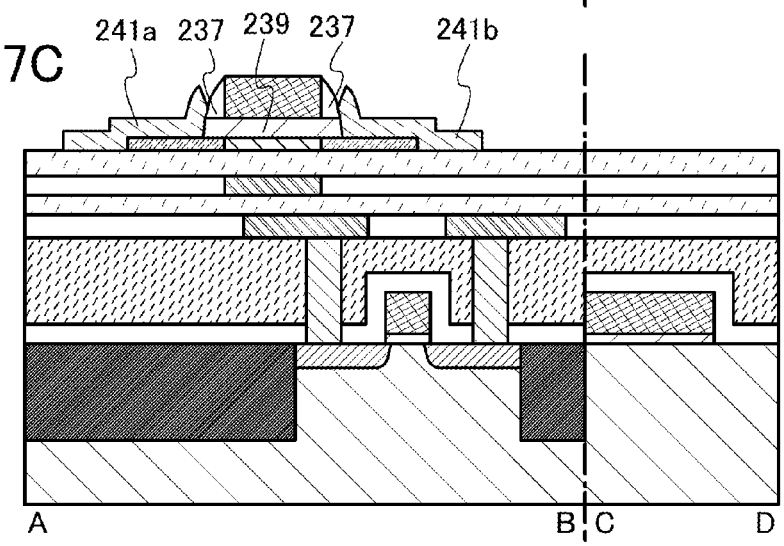

Next, as illustrated in FIG. 7C, sidewall insulating films 237 are formed on side surfaces of the gate electrode 233, and a gate insulating film 239 and electrodes 241a and 241b are formed.

The sidewall insulating film 237 may be formed to have a single layer or a stack including one or more of silicon oxide, silicon oxynitride, silicon nitride oxide, silicon nitride, aluminum oxide, aluminum oxynitride, aluminum nitride oxide, aluminum nitride, and the like. The sidewall insulating film 237 may be formed using an oxide insulating film from which part of oxygen is released by heating in a manner similar to that of the insulating film 225.

Here, a method for forming the sidewall insulating film 237 is described.

First, an insulating film to be the sidewall insulating films 237 is formed over the insulating film 231 and the gate electrode 233. The insulating film is formed by a sputtering method, a CVD method, or the like. Although the thickness of the insulating film is not particularly limited, the thickness is selected as appropriate in consideration of coverage with respect to the shape of the gate electrode 233.

The insulating film is etched to form the sidewall insulating film 237. The etching is highly anisotropic etching, and the sidewall insulating film 237 can be formed in a self-aligning manner by performing the highly anisotropic etching on the insulating film.

The width of the region for relieving an electric field in each of the pair of second regions 235b and 235c containing the dopant depends on the width of the sidewall insulating films 237, and the width of the sidewall insulating films 237 depends on the thickness of the gate electrode 233. Thus, the thickness of the gate electrode 233 may be determined so that the width of the region for relieving an electric field has a desired value.

When the sidewall insulating films 237 are formed, the insulating film 231 is also etched by the highly anisotropic etching and the oxide semiconductor film 229 is exposed, so that the gate insulating film 239 is formed.

The pair of electrodes 241a and 241b can be formed using a material similar to that of the wirings 223a and 223b as appropriate. Note that the pair of electrodes 241a and 241b may function as wirings.

The pair of electrodes 241a and 241b is formed by a printing method or an inkjet method. Alternatively, the pair of electrodes 241a and 241b is formed in such a manner that a conductive film is formed by a sputtering method, a CVD method, an evaporation method, or the like and then part of the conductive film is selectively etched.

The pair of electrodes 241a and 241b is preferably formed to be in contact with side surfaces of the sidewall insulating films 237 and the gate insulating film 239. That is, it is preferable that end portions of the pair of electrodes 241a and 241b of the transistor be on the sidewall insulating films 237 and entirely cover the exposed portions of the pair of second regions 235b and 235c containing the dopant in the oxide semiconductor film 229. As a result, regions in the pair of second regions 235b and 235c containing the dopant that are in contact with the pair of electrodes 241a and 241b serve as a source region and a drain region, and regions in the pair of second regions 235b and 235c containing the dopant that overlap with the gate insulating film 239 and the sidewall insulating film 237 serve as electric-field relaxation regions. In addition, since the width of the electric-field relaxation regions can be controlled with the length of the sidewall insulating films 237, high accuracy in alignment of a mask for forming the pair of electrodes 241a and 241b is not strictly required. Accordingly, variations among a plurality of transistors can be reduced.

Note that the sidewall insulating films 237 are provided in contact with the side surfaces of the gate electrode 233 in this embodiment; however, the present invention is not limited to this structure, and the sidewall insulating films 237 are not necessarily provided. Although the sidewall insulating films 237 are formed after the pair of second regions 235b and 235c is formed in this embodiment, the present invention is not limited to this structure, and the pair of second regions 235b and 235c may be formed after the sidewall insulating films 237 are formed. With such a structure, the first region 235a can be extended to overlap with the sidewall insulating films 237.

Figure 8A:
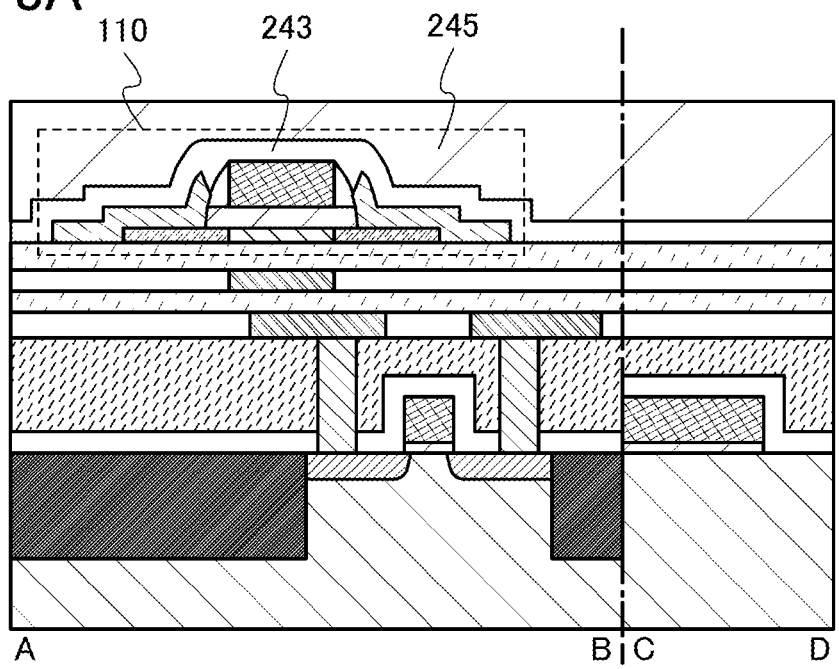
FIGS. 8A and 8B are cross-sectional views illustrating some of steps of manufacturing the processor according to one embodiment of the disclosed invention.

Next, as illustrated in FIG. 8A, an insulating film 243 and an insulating film 245 are formed by a sputtering method, a CVD method, a coating method, a printing method, or the like.

The insulating films 243 and 245 may each be formed to have a single layer or a stack including one or more of silicon oxide, silicon oxynitride, silicon nitride oxide, silicon nitride, aluminum oxide, aluminum oxynitride, aluminum nitride oxide, aluminum nitride, and the like. Note that with the use of an insulating film which prevents diffusion of oxygen into the outside as the insulating film 245, oxygen released from the insulating film 243 can be supplied to the oxide semiconductor film. Typical examples of the insulating film which prevents diffusion of oxygen into the outside include films of aluminum oxide, aluminum oxynitride, and the like. In addition, with the use of an insulating film which prevents diffusion of hydrogen from the outside as the insulating film 245, diffusion of hydrogen from the outside into the oxide semiconductor film can be reduced, and vacancies in the oxide semiconductor film can be reduced. Typical examples of the insulating film which prevents diffusion of hydrogen from the outside include films of silicon nitride, silicon nitride oxide, aluminum nitride, aluminum nitride oxide, and the like. Further, when the insulating film 243 has a three-layer structure of an oxide insulating film from which part of oxygen is released by heating, an insulating film which prevents diffusion of oxygen into the outside, and an oxide insulating film, oxygen can be efficiently diffused into the oxide semiconductor film and oxygen can be prevented from being released into the outside. Accordingly, variations in transistor characteristics can be reduced even at high temperature and in high humidity.

Through the above steps, as illustrated in FIG. 8A, the transistor 110 including an oxide semiconductor film can be formed.

As described above, the oxide semiconductor film 229 is preferably highly purified by sufficient removal of impurities such as hydrogen and sufficient supply of oxygen so as to be supersaturated with oxygen. Specifically, the hydrogen concentration in the oxide semiconductor film 229 is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. Note that the concentration of hydrogen in the oxide semiconductor film 229 is measured by secondary ion mass spectrometry (SIMS). When the oxide semiconductor film 229 in which the hydrogen concentration is sufficiently reduced for high purification and defect states in an energy gap due to oxygen deficiency are reduced by sufficient supply of oxygen is used for the transistor 110, off-state current (per unit channel width (1 µm) here) at room temperature (25° C.) is 100 zA or lower, preferably 10 zA or lower, for example. In this manner, with the use of an i-type (intrinsic) or substantially i-type oxide semiconductor film 229, the transistor 110 having very good off-state current characteristics can be obtained.

Although the transistor 110 in this embodiment has a top-gate structure, the present invention is not limited thereto, and the transistor 110 may have a bottom-gate structure. Further, in the transistor 110 in this embodiment, the pair of electrodes 241a and 241b is in contact with at least part of upper surfaces of the pair of second regions 235b and 235c; however, the present invention is not limited to this structure, and the pair of second regions 235b and 235c may be in contact with at least part of the pair of electrodes 241a and 241b, for example.

Next, part of each of the insulating films 215, 217, 221, 225, 243, and 245 is selectively etched, so that openings are formed to expose part of each of the gate electrode 209, the electrode 241a, and the electrode 241b. After a conductive film is formed in the openings, part of the conductive film is selectively etched; thus, a wiring 249 which is in contact with the electrode 241b and a wiring 250 which is in contact with the electrode 241a are formed. The wiring 249 and the wiring 250 can be formed using a material used for the contact plugs 219a and 219b as appropriate.

Here, the wiring 249 functions as the node M1 which electrically connects the drain electrode of the transistor 110 to the gate electrode 209 of the transistor 112. The wiring 250 functions as the source electrode of the transistor 110 and is electrically connected to the volatile memory element 132 in FIG. 2B. Note that in the case where the capacitor 111 in FIG. 2B is provided, for example, an insulating film over the wiring 250 and a conductive film overlapping with the wiring 250 with the insulating film therebetween may be provided.

Figure 8B:
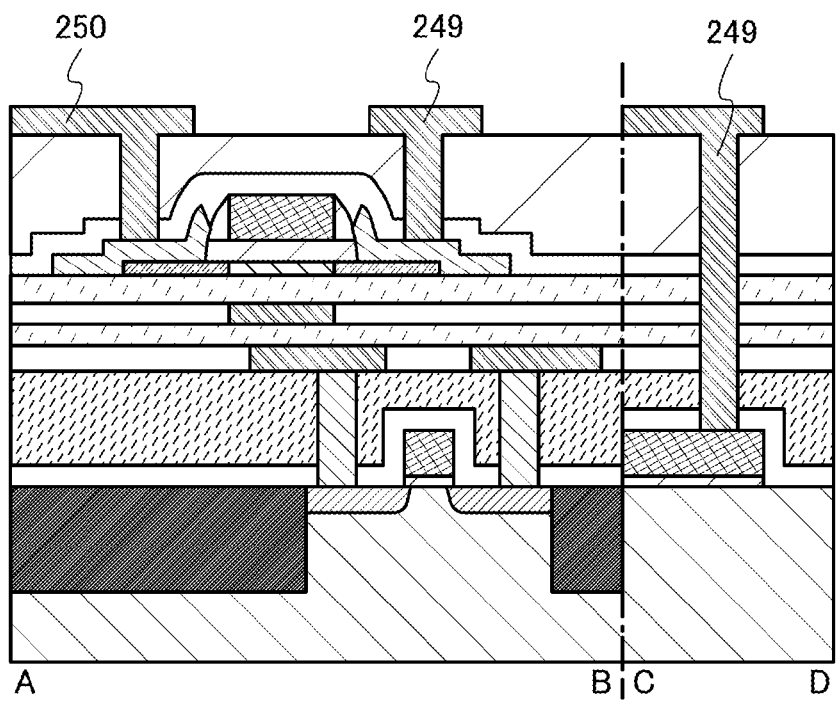

In FIG. 8B, the drain electrode of the transistor 110 and the gate electrode 209 of the transistor 112 are connected to each other through the wiring 249; however, this embodiment is not limited to this structure. For example, an upper surface of the gate electrode of the transistor 112 may be exposed from an upper surface of the insulating film provided over the transistor 112, and one of the source electrode and the drain electrode of the transistor 110 may be formed to be in direct contact with the upper surface of the gate electrode.

Through the above steps, the memory block of the processor including the transistors 110 and 112 can be manufactured.

Figure 9A:
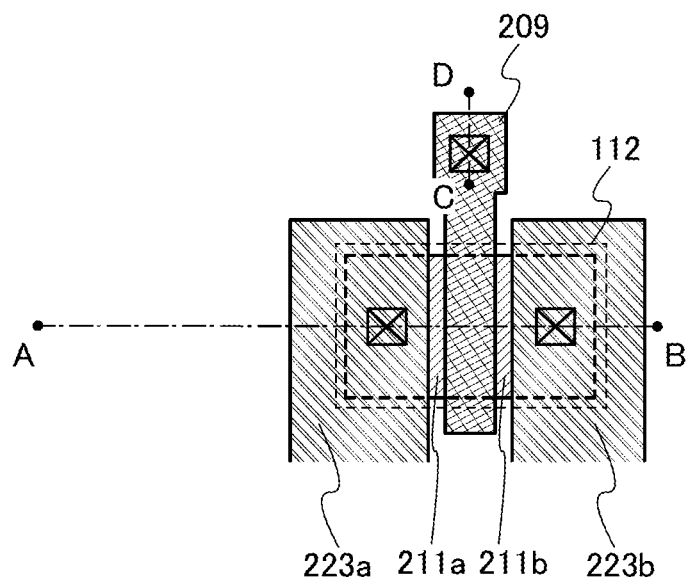
FIGS. 9A and 9B are plan views illustrating part of the processor according to one embodiment of the disclosed invention.
Figure 9B:
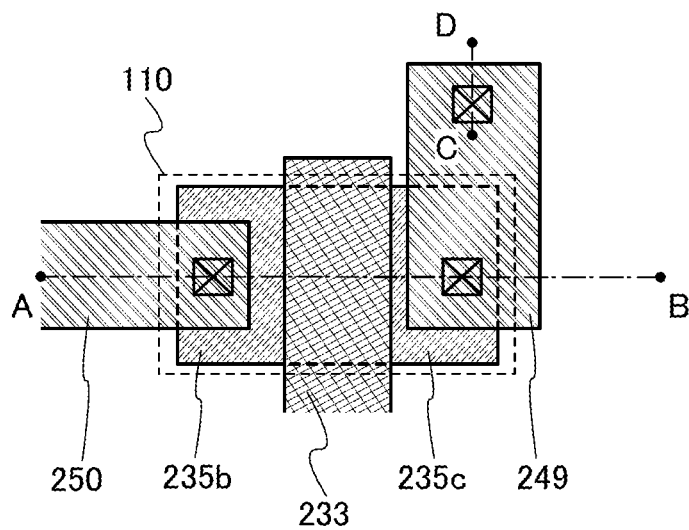

Here, FIGS. 9A and 9B illustrate an example of a plan view of the memory block of the processor that corresponds to the cross-sectional view in FIG. 8B. FIG. 9A is a plan view of components below the insulating film 225, i.e., the transistor 112. FIG. 9B is a plan view of components over the insulating film 225, i.e., the transistor 110. Note that some of the components (e.g., the insulating film 215) are not illustrated in FIGS. 9A and 9B for easy understanding. Further, each of the cross-sectional views in FIGS. 5A to 5D, FIGS. 6A to 6C, FIGS. 7A to 7C, and FIGS. 8A and 8B is taken along dashed-dotted line A-B and dashed-dotted line C-D in FIGS. 9A and 9B.

In the memory block of the processor in FIGS. 9A and 9B, as illustrated in FIG. 8B, the transistor 110 is electrically connected to the transistor 112 in a region shown in the cross section taken along dashed-dotted line C-D. Here, at least part of the transistor 110 overlaps with at least part of the transistor 112. It is preferable that at least part of the oxide semiconductor film 235 overlap with at least part of the n-type impurity region 211a or 211b. With such a planar layout, an increase in area occupied by the memory block of the processor due to provision of the transistor including a wide band gap semiconductor such as an oxide semiconductor can be suppressed. As a result, a high capacity of the memory block of the processor can be easily achieved.

As described above, the transistor of the nonvolatile memory element is formed using a material capable of sufficiently reducing off-state current of a transistor (e.g., an oxide semiconductor material that is a wide band gap semiconductor). Using a semiconductor material capable of sufficiently reducing off-state current of a transistor makes it possible to hold a potential for a long time without supply of power; thus, data can be retained in the nonvolatile memory element even when the logic unit is powered off.

By using the power gating driving method described in the above embodiment in the processor including the nonvolatile memory element, leakage current from the high potential power supply lines can be reduced. Thus, a processor in which low power consumption is achieved can be provided.

The structures, methods, and the like in this embodiment can be combined with each other, or can be combined with any of the structures, methods, and the like in the other embodiments as appropriate.

Embodiment 3

A central processing unit (CPU) can be formed using at least part of the processor described in the above embodiment.

Figure 10:
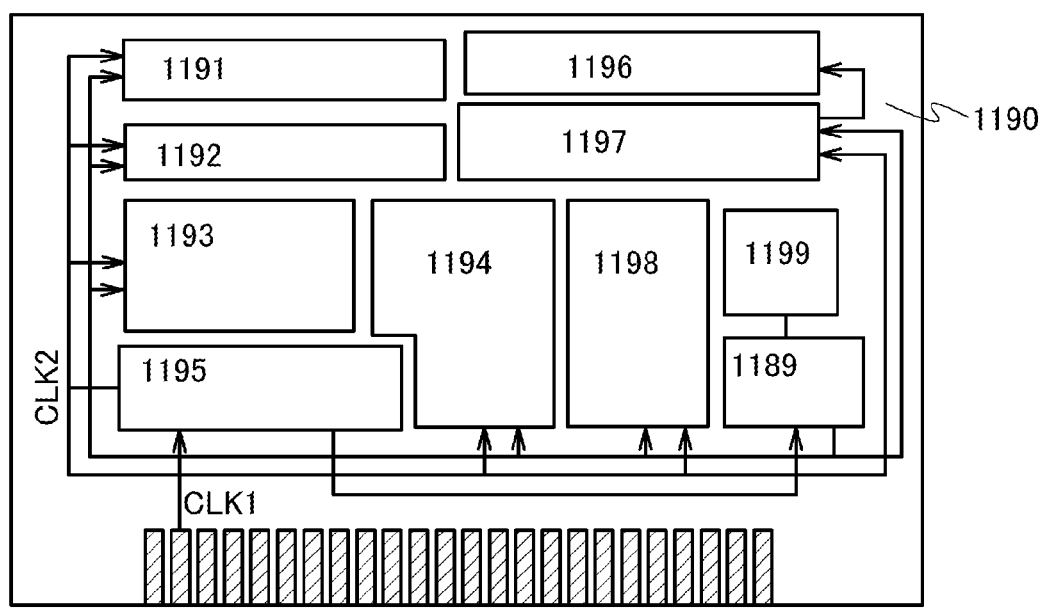
FIG. 10 is a block diagram of a CPU according to one embodiment of the disclosed invention.

FIG. 10 is a block diagram illustrating a specific structure of a CPU. The CPU in FIG. 10 includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189, over a substrate 1190. A semiconductor substrate, an SOI substrate, a glass substrate, or the like is used as the substrate 1190. The ROM 1199 and the ROM interface 1189 may be provided over a separate chip. Needless to say, FIG. 10 illustrates only a simplified structure example of the CPU, and an actual CPU may have various structures depending on the application.

An instruction input to the CPU through the bus interface 1198 is input to the instruction decoder 1193 and decoded, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU in FIG. 10, the register 1196 is formed using the volatile memory element and the nonvolatile memory element described in the above embodiment.

In the CPU in FIG. 10, the register controller 1197 corresponds to the storage/restorage controller 106 described in the above embodiment and selects data storage and data restorage in the register 1196. In the case where supply of power to the register 1196 is stopped, data is stored from a volatile memory element to a nonvolatile memory element in the register 1196. In the case where supply of power to the register 1196 is started, data is restored from the nonvolatile memory element to the volatile memory element in the register 1196.

The above circuit element of the CPU is divided into the first to third circuit blocks described in Embodiment 1 based on the operation of the CPU and a power gating driving method is employed, which enables leakage current from the high potential power supply lines from being reduced. Thus, a processor in which low power consumption is achieved can be provided.

The structures, methods, and the like in this embodiment can be combined with any of the structures, methods, and the like in the other embodiments as appropriate.

Embodiment 4

A semiconductor device including the processor disclosed in this specification can be applied to a variety of electronic devices (including game machines). Examples of the electronic devices include display devices of televisions, monitors, and the like, lighting devices, desktop personal computers and notebook personal computers, word processors, image reproduction devices which reproduce still images or moving images stored in recording media such as digital versatile discs (DVDs), portable compact disc (CD) players, radio receivers, tape recorders, headphone stereos, stereos, cordless phone handsets, transceivers, portable wireless devices, cellular phones, car phones, portable game machines, calculators, portable information terminals, electronic notebooks, e-book readers, electronic translators, audio input devices, cameras such as video cameras and digital still cameras, electric shavers, high-frequency heating appliances such as microwave ovens, electric rice cookers, electric washing machines, electric vacuum cleaners, air-conditioning systems such as air conditioners, dishwashers, dish dryers, clothes dryers, futon dryers, electric refrigerators, electric freezers, electric refrigerator-freezers, freezers for preserving DNA, smoke detectors, radiation counters, and medical equipment such as dialyzers. Further, the examples include industrial equipment such as guide lights, traffic lights, belt conveyors, elevators, escalators, industrial robots, and power storage systems. Oil engines, moving objects driven by electric motors using power from non-aqueous secondary batteries, and the like are also included in the range of electric devices. Examples of the moving objects include electric vehicles (EV), hybrid electric vehicles (HEV) which include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats or ships, submarines, helicopters, aircrafts, rockets, artificial satellites, space probes, planetary probes, spacecrafts, and the like. Specific examples of these electronic devices are illustrated in FIGS. 11A and 11B.

Figure 11A:
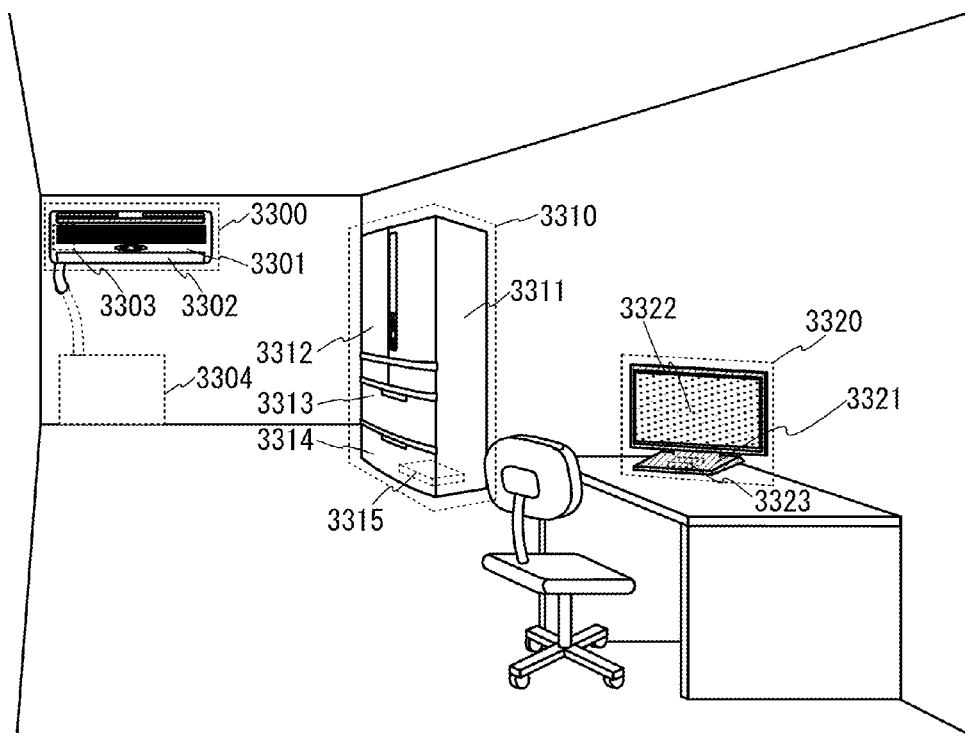
FIGS. 11A and 11B are diagrams illustrating electronic devices.
Figure 11B:
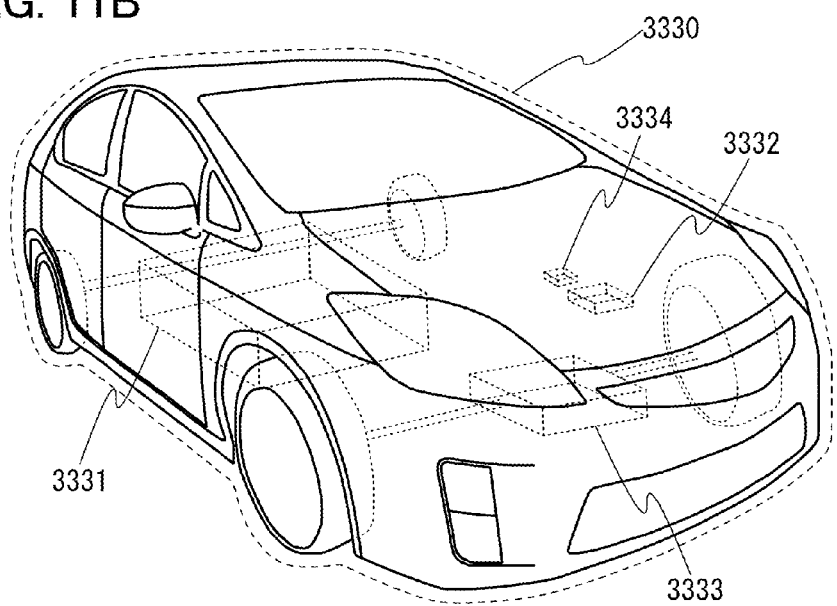

In FIG. 11A, an air conditioner which includes an indoor unit 3300 and an outdoor unit 3304 is an example of an electric device using the CPU including the processor described in the above embodiment. Specifically, the indoor unit 3300 includes a housing 3301, an air outlet 3302, a CPU 3303, and the like. Although the CPU 3303 is provided in the indoor unit 3300 in FIG. 11A, the CPU 3303 may be provided in the outdoor unit 3304. Alternatively, the CPU 3303 may be provided in both the indoor unit 3300 and the outdoor unit 3304. As described in the above embodiment, the power consumption of the CPU can be reduced; thus, the power consumption of the air conditioner can be reduced.

In FIG. 11A, an electric refrigerator-freezer 3310 is an example of an electric device provided with the CPU formed using an oxide semiconductor. Specifically, the electric refrigerator-freezer 3310 includes a housing 3311, a door for a refrigerator 3312, a door for a freezer 3313, a door for a vegetable drawer 3314, a CPU 3315, and the like. In FIG. 11A, the CPU 3315 is provided in the housing 3311. When the CPU including the processor described in the above embodiment is used as the CPU 3315 of the electric refrigerator-freezer 3310, the power consumption of the electric refrigerator-freezer 3310 can be reduced.

In FIG. 11A, an image display device 3320 is an example of an electric device provided with the CPU formed using an oxide semiconductor. Specifically, the image display device 3320 includes a housing 3321, a display portion 3322, a CPU 3323, and the like. In FIG. 11A, the CPU 3323 is provided in the housing 3321. When the CPU including the processor described in the above embodiment is used as the CPU 3323 of the image display device 3320, the power consumption of the image display device 3320 can be reduced.

An example of an electric vehicle which is an example of an electric device is described in FIG. 11B. An electric vehicle 3330 is equipped with a secondary battery 3331. The output of power of the secondary battery 3331 is adjusted by a control circuit 3332, and the power is supplied to a driving device 3333. The control circuit 3332 is controlled by a processing unit 3334 including a ROM, a RAM, a CPU, or the like which is not illustrated. When the CPU including the processor described in the above embodiment is used as the CPU in the electric vehicle 3330, the power consumption of the electric vehicle 3330 can be reduced.

The driving device 3333 includes a DC motor or an AC motor either alone or in combination with an internal-combustion engine. The processing unit 3334 outputs a control signal to the control circuit 3332 based on input information such as information of operation (e.g., acceleration, deceleration, or stop) by a driver or information during driving (e.g., information on an upgrade or a downgrade, or information on a load on a driving wheel) of the electric vehicle 3330. The control circuit 3332 adjusts electric energy supplied from the secondary battery 3331 in accordance with the control signal of the processing unit 3334 to control the output of the driving device 3333. In the case where the AC motor is mounted, although not illustrated, an inverter which converts direct current into alternate current is also incorporated.

This embodiment can be combined with any of the other embodiments as appropriate.

This application is based on Japanese Patent Application serial no. 2012-105140 filed with Japan Patent Office on May 2, 2012, the entire contents of which are hereby incorporated by reference.

What is claimed is:

1. A processor comprising:
a first circuit block connected to a first high potential power supply line;
a second circuit block comprising a first memory element and connected to a second high potential power supply line; and
a third circuit block comprising a second memory element and connected to a third high potential power supply line,
wherein the first high potential power supply line is electrically connected to a fourth high potential power supply line through a first switch and a second switch,
wherein the second high potential power supply line is electrically connected to the fourth high potential power supply line through the first switch,
wherein the third high potential power supply line is electrically connected to the fourth high potential power supply line through the first switch and a third switch and to the first high potential power supply line through a fourth switch,
wherein the first switch and the second switch are configured to be in a conduction state in an arithmetic processing period,
wherein the first switch and the third switch are configured to be in a conduction state in a data storage period and a data restorage period, and
wherein the first switch and the forth switch are configured to be in a conduction state in a charge period.

2. The processor according to claim 1, wherein the first memory element is a register.

3. The processor according to claim 1, wherein the second memory element comprises a first transistor comprising an oxide semiconductor.

4. The processor according to claim 1, wherein the first switch comprises a second transistor comprising an oxide semiconductor.

5. The processor according to claim 1, wherein at least one of the second switch to the fourth switch comprises a third transistor comprising an oxide semiconductor.

6. The processor according to claim 1,
wherein the third switch and the fourth switch are configured to be in a non-conduction state in the arithmetic processing period,
wherein the second switch and the fourth switch are configured to be in a non-conduction state in the data storage period and the data restorage period,
wherein the first switch is in a non-conduction state in a power-off period, and
wherein the second switch and the third switch are in a non-conduction state in the charge period.

7. The processor according to claim 1,
wherein the second memory element comprises a first transistor comprising an oxide semiconductor and a capacitor.

8. The processor according to claim 1,
wherein the first circuit block, the second circuit block, and the third circuit block are connected to a low potential power supply line.

9. A processor comprising:
a first circuit block for performing arithmetic during a arithmetic processing period, the first circuit block being electrically connected to a power source line through a first switch and a second switch;
a second circuit block for writing and reading date during the arithmetic processing period, the second circuit block being electrically connected to the power source line through the first switch;
a third circuit block for storing the data during a data storage period, the third circuit block being electrically connected to the power source line through the first switch and a third switch and to the first circuit block through a fourth switch,
wherein the first switch is configured to stop supplying power source to the first circuit block, the second circuit block, and the third circuit block during a power-off period in which the data written in the data storage period is stored in the third circuit block.

10. The processor according to claim 9,
wherein the first switch and the forth switch are configured to be in a conduction state in a charge period.

11. The processor according to claim 9,
wherein electric charge from the first circuit block is configured to be accumulated in the third circuit block through the fourth switch in a first charge period, and
wherein electric charge from the third circuit block is configured to be accumulated in the first circuit block through the fourth switch in a second charge period.

12. The processor according to claim 9,
wherein the first switch and the second switch are connected to each other in series, and the first switch and the third switch are connected to each other in series.

13. The processor according to claim 9,
wherein the second switch and the third switch are connected to each other in series.

14. The processor according to claim 9,
wherein the processor is configured so that the first circuit block and the third circuit block are electrically connected when the second switch and the third switch are in a conduction state or when the fourth switch is in a conduction state.

15. The processor according to claim 9, wherein the first circuit block comprises a register.

16. The processor according to claim 9, wherein the second circuit block comprises a first transistor comprising an oxide semiconductor.

17. The processor according to claim 9, wherein the first switch comprises a second transistor comprising an oxide semiconductor.

18. The processor according to claim 9, wherein at least one of the second switch to the fourth switch comprises a third transistor comprising an oxide semiconductor.

19. The processor according to claim 9,
wherein the second circuit block comprises a first transistor comprising an oxide semiconductor and a capacitor.

20. The processor according to claim 9,
wherein the first circuit block, the second circuit block, and the third circuit block are connected to a low potential power supply line.

21. A driving method of a processor comprising the steps of:
performing arithmetic processing by a first circuit block in an arithmetic period during which power is supplied to the first circuit block through a first switch and a second switch;
writing data to a second circuit block in the arithmetic period during which power is supplied to the first circuit block and the second circuit block through the first switch and the second switch;
accumulating electric charge from the first circuit block to a third circuit block through a forth switch in a first charge period;
writing the data of the second circuit block to the third circuit block in a data storage period during which power is supplied to the second circuit block and the third circuit block through the first switch and a third switch;
stopping supply of power to the first circuit block, the second circuit block, and the third circuit block; and
writing the data of the third circuit block to the second circuit block in a data restorage period during which power is supplied to the second circuit block and the third circuit block through the first switch and the third switch.

22. The driving method of the processor according to claim 21, comprising:
accumulating electric charge from the third circuit block to the first circuit block through the forth switch in a second charge period.

23. The driving method of the processor according to claim 21,
wherein power is not supplied to the third circuit block in the arithmetic period, and
wherein power is not supplied to the first circuit block in the data storage period and the data restorage period.

* * * * *